(12) United States Patent
Uhm et al.

(10) Patent No.: US 12,205,794 B2
(45) Date of Patent: Jan. 21, 2025

(54) ANTENNA STRUCTURE AND PLASMA GENERATING DEVICE USING SAME

(71) Applicant: EN2CORE TECHNOLOGY INC., Daejeon (KR)

(72) Inventors: Sae Hoon Uhm, Gyeonggi-do (KR); Yun Seong Lee, Daejeon (KR); Yeong Hoon Sohn, Daejeon (KR); Se Hong Park, Daejeon (KR)

(73) Assignee: EN2CORE TECHNOLOGY INC., Daejeon (KR)

( * ) Notice: Subject to any disclaimer, the term of this patent is extended or adjusted under 35 U.S.C. 154(b) by 244 days.

(21) Appl. No.: 17/759,987

(22) PCT Filed: Feb. 19, 2021

(86) PCT No.: PCT/KR2021/002139
§ 371 (c)(1),
(2) Date: Jan. 5, 2023

(87) PCT Pub. No.: WO2021/167408
PCT Pub. Date: Aug. 26, 2021

(65) Prior Publication Data
US 2023/0139675 A1   May 4, 2023

(30) Foreign Application Priority Data

Feb. 19, 2020   (KR) .................. 10-2020-0020704
Feb. 19, 2020   (KR) .................. 10-2020-0020705

(51) Int. Cl.
*H01J 37/32*   (2006.01)
*H01Q 1/26*   (2006.01)

(52) U.S. Cl.
CPC .......... *H01J 37/3211* (2013.01); *H01Q 1/26* (2013.01); *H01J 2237/327* (2013.01)

(58) Field of Classification Search
CPC .. H01J 37/3211; H01J 2237/327; H03H 7/40; H03H 2001/0057; H03H 1/00;
(Continued)

(56) References Cited

U.S. PATENT DOCUMENTS

| 5,436,528 | A | 7/1995 | Paranjpe |
| 6,331,754 | B1 | 12/2001 | Satoyoshi et al. |

(Continued)

FOREIGN PATENT DOCUMENTS

| CN | 1392754 A | 1/2003 |
| CN | 1220410 | 9/2005 |

(Continued)

OTHER PUBLICATIONS

Extended European Search Report from European Patent Application No. 21756465.7 issued on Nov. 8, 2023 (8 pages).

(Continued)

*Primary Examiner* — Monica C King
(74) *Attorney, Agent, or Firm* — Perkins Coie LLP

(57) ABSTRACT

This invention is an antenna structure inducing plasma in a chamber with applied alternative power, comprising: a first antenna segment and a second antenna segment arranged based on a virtual central axis to have a first curvature radius and a second curvature radius respectively, the central axis crossing a first plane, and a first capacitive load electrically connecting the first antenna segment and the second antenna segment, wherein the first antenna segment extends from one end of the first capacitive load with the first curvature radius having a first length and the second antenna segment extends from other end of the first capacitive load with the second curvature radius having a second length, and wherein a sum of the first length and the second length is shorter than a circumference of the first curvature radius or the second curvature radius.

22 Claims, 23 Drawing Sheets

(58) Field of Classification Search
CPC .......... H01Q 7/00; H01Q 1/248; H01Q 7/005; H01Q 7/08; H01Q 21/24; H01Q 1/02; H01Q 1/26
See application file for complete search history.

(56) References Cited

U.S. PATENT DOCUMENTS

| | | | |
|---|---|---|---|
| 2002/0189763 A1 | 12/2002 | Kwon et al. | |
| 2003/0001511 A1 | 1/2003 | Howald et al. | |
| 2003/0057845 A1 | 3/2003 | Edamura et al. | |
| 2011/0233170 A1 | 9/2011 | Yamazawa | |
| 2012/0073756 A1 | 3/2012 | Yamazawa | |
| 2012/0074100 A1 | 3/2012 | Yamazawa | |
| 2012/0247679 A1 | 10/2012 | Yamazawa | |
| 2012/0305527 A1 | 12/2012 | Kim et al. | |
| 2016/0099130 A1 | 4/2016 | Ando et al. | |
| 2018/0122619 A1 | 5/2018 | Uhm et al. | |
| 2023/0136018 A1* | 5/2023 | Uhm | H01J 37/32357 315/111.21 |
| 2023/0170185 A1* | 6/2023 | Uhm | H01J 37/3299 156/345.48 |

FOREIGN PATENT DOCUMENTS

| | | |
|---|---|---|
| EP | 1168415 A2 | 1/2002 |
| EP | 3214637 A1 | 9/2017 |
| EP | 3537471 A1 | 9/2019 |
| JP | H11233289 A | 8/1999 |
| JP | 2001028299 A | 1/2001 |
| JP | 2002008996 A | 1/2002 |
| JP | 2003086577 A | 3/2003 |
| JP | 2004-532506 | 10/2004 |
| JP | 2011198539 A | 10/2011 |
| JP | 2012253349 A | 12/2012 |
| JP | 2020502721 A | 1/2020 |
| KR | 2002-0007155 | 1/2002 |
| KR | 2002-0096259 | 12/2002 |
| KR | 10-2004-0062846 | 7/2004 |
| KR | 10-2009-0031624 | 3/2009 |
| KR | 2009-0027479 | 3/2009 |
| KR | 10-2009-0090638 | 8/2009 |
| KR | 10-2013-0042875 | 4/2013 |
| KR | 10-2016-0001661 | 1/2016 |
| KR | 10-2017-0012460 | 2/2017 |
| TW | 350976 | 1/1999 |
| TW | 538439 | 6/2003 |
| TW | 201615063 A | 4/2016 |
| TW | I580324 | 4/2017 |
| TW | 201742678 | 12/2017 |

OTHER PUBLICATIONS

Office Action dated Nov. 2, 2022, for co-pending KR Application No. 10-2021-0022153, filed Feb. 18, 2021, 15 pages with unofficial translation.
Translated International Search Report and Written Opinion for PCT/KR2021/002139, dated Jun. 18, 2021, 11 pages.
Office Action of TW Patent Application No. 112131943 issued on Jun. 21, 2024.
Office Action of JP Patent Application No. 2022-549548 issued on Oct. 15, 2024.

* cited by examiner (a)        (b)

ANTENNA STRUCTURE AND PLASMA GENERATING DEVICE USING SAME

BACKGROUND

Field of Invention

The present invention relates to an antenna structure and a plasma generating device using the same, and more particularly, a device which induces plasma generation by generating an induced electric field and an induced magnetic field using an antenna structure including a plurality of antenna segments and a plurality of capacitive elements.

Discussion of Related Art

Technologies using plasma are being used in various industrial fields such as air, water, and soil purification environmental technology fields and solar cell and hydrogen energy technology fields as well as semiconductor, display, and medical equipment technology fields.

There is a wide variety of methods of generating such plasma, such as direct current (DC) discharge methods including a corona discharge, a glow discharge, and an arc discharge, alternating current (AC) discharge methods including a capacitive coupled discharge and an inductively coupled discharge, a shock wave discharge method, and a high energy beam discharge method. Among the methods, the inductively coupled discharge using a simple structure and having high utilization is in the spotlight.

On the other hand, in the conventional inductively coupled plasma generating devices, due to factors such as internal/external pressure, a type or property of a supplied gas, a power applied to a device, a current flowing in components or a voltage applied thereto, and power consumption, the control of plasma has been unstable, and the durability of the device has been impaired. Furthermore, such problems become more serious as the volume, area, and the like of the plasma generating device are increased, and thus, there is a need for a method of solving these issues.

SUMMARY OF THE INVENTION

Technical Problem

The present invention is directed to providing an antenna structure including a plurality of segments and a plurality of capacitive elements, and a plasma generating device using the same.

The present invention is directed to providing an antenna structure having a large volume or a large area so as to generate plasma in a large area, and a plasma generating device using the same.

The present invention is directed to providing an antenna structure having a structure in which a voltage is distributed so as to safely generate plasma at a high voltage formed in an inductor due to a high driving frequency or a large input current, and a plasma generating device using the same.

The present invention is directed to providing a plasma generating device for preventing damage to a plasma generating device due to heat generated when plasma is induced.

The present invention is directed to providing a plasma generating device which uses a coolant to effectively absorb heat generated when plasma is induced.

The objects of the present invention are not limited to the aforementioned objects, and other objects which are not described herein should be clearly understood by those skilled in the art, to which the present invention belongs, from the following detailed description and the accompanying drawings.

Solution for Problem

According to an aspect of the present disclosure, there is provided an antenna structure inducing a plasma in a chamber by receiving AC power, comprising: a first and second antenna segment, arranged on a first plane intersecting a virtual central axis, wherein the first antenna segment has a first radius of curvature about the central axis and the second antenna segment has a second radius of curvature about the central axis; and a first capacitive load, electrically connecting the first antenna segment and the second antenna segment in series; wherein the first antenna segment, having the first radius of curvature, extends from one end of the first capacitive load by a first length, and the second antenna segment, having the second radius of curvature, extends from other end of the first capacitive load by a second length, and wherein a total of the first length and the second length is less than a circumference corresponding to the first radius of curvature or the second radius of curvature.

According to another aspect of the present disclosure, there is provided a plasma generating device, comprising: a plasma generating unit, including an inner space where a plasma is induced; and a first antenna structure, having a first radius of curvature about a virtual central axis and disposed outside of the plasma generating unit; wherein the first antenna structure includes a plurality of first antenna segments having the first radius of curvature and at least one first capacitive load arranged between the plurality of first antenna segments such that the plurality of first antenna segments are electrically connected in series, wherein the plurality of first antenna segments overlap at least partially with a virtual first plane perpendicular to the central axis, and wherein each of the plurality of first antenna segments has a first length, and a total length of the plurality of first antenna segments is less than a circumference corresponding to the first radius of curvature.

According to another aspect of the present disclosure, there is provided an antenna structure disposed outside of a plasma generating unit and providing a induced electric field to induce a plasma inside of the plasma generating unit, comprising: a first antenna, disposed along an outer surface of the plasma generating unit and inducing the electric field; wherein a first coolant channel where a coolant flows is formed inside the first antenna, wherein the first antenna includes a first inner diameter surface parallel to an outer wall of the plasma generating unit and is in surface contact with the plasma generating unit through the first inner diameter surface, wherein the first antenna includes a first surface defining the first coolant channel and being parallel to the outer wall of the plasma generating unit and the first inner diameter surface, and wherein the antenna structure absorbs heat from the plasma generating unit through the inner diameter surface and the first surface to prevent the plasma generating unit from increasing in temperature by the plasma.

Technical solutions of the present invention may not be limited to the above, and other technical solutions which are not described herein should be clearly understood by those skilled in the art, to which the present invention belongs, from the present specification and the accompanying drawings.

Effect of Invention

According to the present invention, when a plasma generating device is driven, a maximum voltage applied to an antenna can be reduced due to a capacitive element in an antenna structure.

According to the present invention, when a plasma generating device is driven, a high electromotive force is induced by an antenna structure, thereby maintaining plasma for a longer time.

According to the present invention, when a plasma generating device is driven, a voltage applied to an antenna structure is reduced, thereby reducing energy loss generated in plasma.

According to the present invention, a large area display process or a plurality of semiconductor processes can be performed through plasma induction in a large area.

According to the present invention, it is possible to reduce power consumed by an antenna structure in a plasma generating device.

According to the present invention, a potential difference between antennas in an antenna structure is reduced, thereby more safely generating high density plasma.

According to the present invention, even when an antenna structure is driven using a high-power high-frequency power source, it is possible to prevent damage to a chamber or a dielectric tube due to the high-power high-frequency power source.

According to the present invention, even when heat is generated by plasma, thermal damage to a plasma generating device can be prevented due to an effective heat absorption function of an antenna structure.

According to the present invention, while an antenna structure performs an effective cooling function, it is possible to reduce the influence of a parasitic capacitor.

According to the present invention, while an antenna structure performs an effective cooling function, it is possible to prevent an arc discharge from occurring in a plasma generating device.

Effects of the present invention may not be limited to the above, and other effects which are not described herein should be clearly understood by those skilled in the art, to which the present invention belongs, from the present specification and the accompanying drawings.

BEST MODE OF EMBODIMENT

Figure 1:
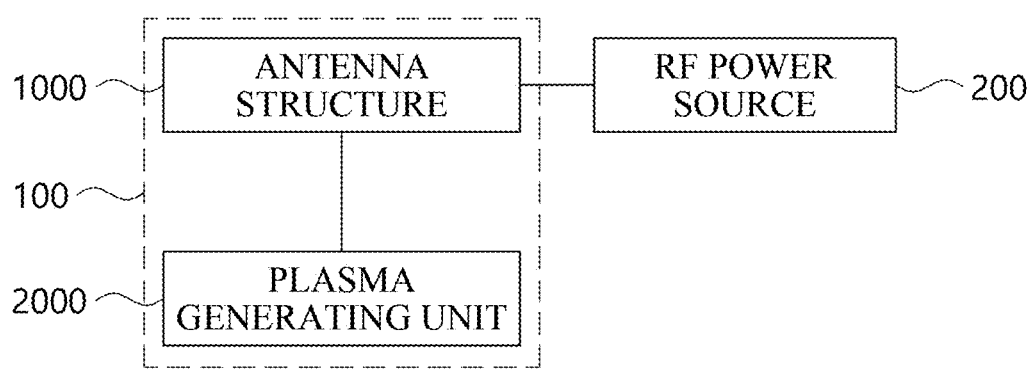
FIG. 1 is a diagram of a plasma system according to one embodiment of the present specification.

According to an aspect of the present disclosure, there is provided an antenna structure inducing a plasma in a chamber by receiving AC power, comprising: a first and second antenna segment, arranged on a first plane intersecting a virtual central axis, wherein the first antenna segment has a first radius of curvature about the central axis and the second antenna segment has a second radius of curvature about the central axis; and a first capacitive load, electrically connecting the first antenna segment and the second antenna segment in series; wherein the first antenna segment, having the first radius of curvature, extends from one end of the first capacitive load by a first length, and the second antenna segment, having the second radius of curvature, extends from other end of the first capacitive load by a second length, and wherein a total of the first length and the second length is less than a circumference corresponding to the first radius of curvature or the second radius of curvature.

DETAILED DESCRIPTION OF EXEMPLARY EMBODIMENTS

The above-described objects, characteristics, and advantages of the present invention will be more apparent by the following detailed description with reference to the accompanying drawings. Since the present invention may be variously modified and have various embodiments, specific embodiments will be shown in the accompanying drawings and described in detail in a detailed description.

Embodiments described in this specification are made to clearly explain the scope of the present invention to those having ordinary skill in the art and are not intended to limit the present invention. It should be interpreted that the present invention may include substitutions and modifications within the technical scope of the present invention.

The accompanying drawings are to facilitate the explanation of the present invention and the shape in the drawings may be exaggerated for the purpose of convenience of explanation, so the present invention should not be limited to the drawings.

Moreover, detailed descriptions about well-known functions or configurations associated with the present invention will be ruled out in order to not unnecessarily obscure the essence of the present invention. It should also be noted that, although ordinal numbers (such as first and second) are used in the following description, they are used only to distinguish similar components.

In addition, the terms "module," "unit," and "parts" for elements used in the following description are given or used interchangeably only for facilitation of preparing this specification, and thus they are not granted a specific meaning or function.

According to an aspect of the present disclosure, there is provided an antenna structure inducing a plasma in a chamber by receiving AC power, comprising: a first and second antenna segment, arranged on a first plane intersecting a virtual central axis, wherein the first antenna segment has a first radius of curvature about the central axis and the second antenna segment has a second radius of curvature about the central axis; and a first capacitive load, electrically connecting the first antenna segment and the second antenna segment in series; wherein the first antenna segment, having the first radius of curvature, extends from one end of the first capacitive load by a first length, and the second antenna segment, having the second radius of curvature, extends from other end of the first capacitive load by a second length, and wherein a total of the first length and the second length is less than a circumference corresponding to the first radius of curvature or the second radius of curvature.

In addition, the first radius of curvature and the second radius of curvature are equal and the first length and the second length are equal, and the first antenna segment and the second antenna segment have equal inductance.

In addition, the antenna structure further comprises a third antenna segment, arranged on the first plane and having a third radius of curvature, which is larger than the first radius of curvature; a fourth antenna segment, arranged on the first plane and having a fourth radius of curvature, which is larger than the second radius of curvature; and a second capacitive load, electrically connecting the third antenna segment and the fourth antenna segment in series; wherein the third antenna segment extends from one end of the second capacitive load by a third length which is longer than the first length, and the fourth antenna segment extends from other end of the second capacitive load by a fourth length which is longer than the second length.

In addition, a straight line passing through the first and the second capacitive loads passes through the central axis.

In addition, a central angle of a sector, having the first antenna segment as an arc, is equal to a central angle of a sector, having the third antenna segment as an arc.

In addition, the antenna structure further comprises a turn-to-turn capacitive load, electrically connecting the second antenna segment and the third antenna segment in series.

In addition, the first capacitive load, the second capacitive load, and the turn-to-turn capacitive load have equal capacitance.

In addition, the antenna structure further comprises a fifth antenna segment, having the first radius of curvature about the central axis; a sixth antenna segment, having the second radius of curvature; and a third capacitive load, positioned between the fifth and the sixth antenna segments and electrically connecting the fifth and the sixth antenna segments in series; wherein the fifth antenna segment and the sixth antenna segment are arranged on a second plane intersecting the central axis, and wherein the first plane and the second plane are different planes.

In addition, the antenna structure further comprises a first interlayer capacitive load, electrically connecting the second antenna segment and the fifth antenna segment in series.

In addition, the antenna structure further comprises a seventh antenna segment, having the first radius of curvature about the central axis; an eighth antenna segment, having the second radius of curvature; a fourth capacitive load, positioned between the seventh and the eighth antenna segments and electrically connecting the seventh and the eighth antenna segments in series; and a second interlayer capacitive load, electrically connecting the sixth antenna segment and the seventh antenna segment in series; wherein the seventh antenna segment and the eighth antenna segment are arranged on a third plane which intersects the central axis and is different from the first plane and the second plane, and wherein the first interlayer capacitive load and the second interlayer capacitive load have a predetermined angle about the central axis.

In addition, the first antenna segment extends from one end to other end and the other end of the first antenna segment is electrically connected to the one end of the first capacitive load, and the second antenna segment extends from one end to other end and the other end of the second antenna segment is electrically connected to the other end of the first capacitive load.

In addition, as the AC power is applied to the antenna structure, a maximum voltage to a reference node at the other end of the first antenna segment corresponds to a maximum voltage to the reference node at the other end of the second antenna segment.

In addition, as the AC power is applied to the antenna structure, a voltage of the other end of the second antenna segment to the one end of the second antenna segment corresponds to a voltage of the other end of the first antenna segment to the one end of the first antenna segment.

In addition, as the AC power is applied to the antenna structure, a maximum voltage value of the other end of the first antenna segment to a reference node corresponds to a maximum voltage value of the one end of the second antenna segment to the reference node.

In addition, at an arbitrary time point after the AC power is applied to the antenna structure, a voltage of the other end of the first antenna segment to a reference node has an opposite sign with a voltage of the one end of the second antenna segment to the reference node.

In addition, the antenna structure further comprises a first point, located between the one end and the other end of the first antenna segment; and a second point, located between the one end and the other end of the second antenna segment; wherein as the AC power is applied to the antenna structure, a maximum voltage of the first point to a reference node corresponds to a maximum voltage of the second point to the reference node.

In addition, at an arbitrary time point after the AC power is applied to the antenna structure, a voltage of the other end of the first antenna segment to a reference node corresponds to a voltage of the one end of the second antenna segment to the reference node.

In addition, the antenna structure is implemented in at least one of a plane type for inducing a plasma in an upper part or lower part of the antenna structure, and a tube type for inducing a plasma in a center of the antenna structure.

According to another aspect of the present disclosure, there is provided a plasma generating device, comprising: a plasma generating unit, including an inner space where a plasma is induced; and a first antenna structure, having a first radius of curvature about a virtual central axis and disposed outside of the plasma generating unit; wherein the first antenna structure includes a plurality of first antenna segments having the first radius of curvature and at least one first capacitive load arranged between the plurality of first antenna segments such that the plurality of first antenna segments are electrically connected in series, wherein the plurality of first antenna segments overlap at least partially with a virtual first plane perpendicular to the central axis, and wherein each of the plurality of first antenna segments has a first length, and a total length of the plurality of first antenna segments is less than a circumference corresponding to the first radius of curvature.

In addition, the plasma generating device further comprises a second antenna structure, having a second radius of curvature larger than the first radius of curvature about the central axis and arranged on the first plane; wherein the second antenna structure includes a plurality of second antenna segments having the second radius of curvature and at least one second capacitive load arranged between the plurality of second antenna segments such that the plurality of second antenna segments are electrically connected in series, and wherein each of the plurality of second antenna segments has the first length, and a total length of the plurality of second antenna segments is less than a circumference corresponding to the second radius of curvature.

Meanwhile, a first to eighth antenna segments described above may be interpreted as indicating any one antenna segment in the antenna structure, respectively, regardless of the order. For example, a first antenna segment and a second antenna segment may mean antenna segments disposed on the same plane.

Furthermore, the series connection described above may include a case in which the elements are directly connected, as well as a case in which the elements are indirectly connected by including other elements between them.

According to another aspect of the present disclosure, there is provided an antenna structure disposed outside of a plasma generating unit and providing a induced electric field to induce a plasma inside of the plasma generating unit, comprising: a first antenna, disposed along an outer surface of the plasma generating unit and inducing the electric field; wherein a first coolant channel where a coolant flows is formed inside the first antenna, wherein the first antenna includes a first inner diameter surface parallel to an outer wall of the plasma generating unit and is in surface contact with the plasma generating unit through the first inner diameter surface, wherein the first antenna includes a first surface defining the first coolant channel and being parallel to the outer wall of the plasma generating unit and the first inner diameter surface, and wherein the antenna structure absorbs heat from the plasma generating unit through the inner diameter surface and the first surface to prevent the plasma generating unit from increasing in temperature by the plasma.

In addition, the first turn antenna includes a first outer diameter surface connecting to the first inner diameter surface, and the first outer diameter surface bends in a direction away from the plasma generating unit along a longitudinal direction.

In addition, the antenna structure further comprises a second antenna electrically connected to the first antenna and disposed to surround the first antenna and a third antenna electrically connected to the second antenna and disposed to surround the second antenna, wherein the second antenna and the third antenna are disposed such that a distance between the first antenna and the second antenna is longer than a distance between the second antenna and the third antenna.

In addition, the antenna structure further comprises a second antenna electrically connected to the first antenna, disposed to surround the first antenna, and formed with at least a second inner diameter surface and a second outer diameter surface, wherein the second inner diameter surface is disposed closer to the plasma generating unit than the second outer diameter surface, and wherein the second inner diameter surface of the second antenna is not parallel to the first inner diameter surface of the first antenna.

In addition, the antenna structure further comprises a second antenna electrically connected to the first antenna, disposed on same plane of the first antenna to surround the first antenna, and formed with at least a second inner diameter surface and a second outer diameter surface, wherein the second inner diameter surface is disposed closer to the plasma generating unit than the second outer diameter surface, and wherein a distance between the second inner diameter surface and the first outer diameter surface increases along a longitudinal direction of the plasma generating unit as getting far from the plane.

In addition, the antenna structure further comprises a second antenna electrically connected to the first antenna and disposed to surround the first antenna, wherein a cross-section of the second antenna is different from a cross-section of the first antenna.

In addition, the antenna structure further comprises a second antenna electrically connected to the first antenna and disposed to surround the first antenna and a connecting member connecting the first antenna and the second antenna, wherein the first antenna and the second antenna have different cross-sections, and wherein a cross-section of one end of the connecting member corresponds to the cross-section of the first antenna and a cross-section of other end of the connecting member corresponds to the cross-section of the second antenna.

In addition, the connecting member includes at least a part of an end portion of the first antenna and at least a part of an expanded end portion of the second antenna.

In addition, the connecting member includes a capacitive element.

In addition, the antenna structure includes a fastening member combined to the first antenna and providing a force of fastening to the first antenna.

According to another aspect of the present disclosure, there is provided a plasma generating device, comprising: a plasma generating unit, including an inner space where a plasma is induced; and an antenna structure, disposed outside of the plasma generating unit and providing an induced electric field to induce a plasma in the inner space of the plasma generating unit; wherein the antenna structure includes a first antenna disposed along an outer surface of the plasma generating unit and inducing the electric field, wherein a first coolant channel where a coolant flows is formed inside the first antenna, wherein the first antenna includes a first inner diameter surface parallel to an outer wall of the plasma generating unit and is in surface contact with the plasma generating unit through the first inner diameter surface, wherein the first antenna includes a first surface defining the first coolant channel and being parallel to the outer wall of the plasma generating unit and the first inner diameter surface, and wherein the antenna structure absorbs heat from the plasma generating unit through the inner diameter surface and the first surface to prevent the plasma generating unit from increasing in temperature by the plasma.

In addition, a thickness of the plasma generating unit is 0.5 mm or more and 30 mm or less.

In addition, a diameter of the plasma generating unit is 10 mm or more and 300 mm or less.

In addition, the plasma generating device further comprises a heat transfer member thermally connected to the plasma generating unit and the antenna structure respectively, wherein the plasma generating unit and the antenna structure are spaced apart from each other, and wherein the heat transfer member is disposed between the plasma generating unit and the antenna structure.

In addition, at least a portion of the plasma generating unit is made of at least one of aluminum oxide, silicon nitride, silicon dioxide, yttrium oxide, ceramic, silicon carbide, and a combination thereof.

In addition, an inner surface of the plasma generating unit defining the inner space is made of silicon carbide.

The present specification relates to an antenna structure and a plasma generating device using the same.

Here, plasma is a phase in which materials receive high energy to be separated into positively charged electrons and negatively charged ions. Plasma may be induced or generated through various methods. Among them, inductively coupled plasma (ICP) is plasma generated due to an inductive electric field or a capacitive electric field formed in a specific space when power is supplied to a coil, an antenna, or the like. The ICP may be generally driven by a high frequency power source such as a radio frequency (RF) source. Meanwhile, hereinafter, for convenience of description, descriptions will be given assuming that plasma generated by a plasma generating device is ICP, but the technical concept of the present specification is not limited thereto.

Here, an antenna may be an inductive element or a load which forms an electric or magnetic field therearound when a voltage or current is applied thereto and may refer to a coil or an inductor. Furthermore, the antenna may refer to an equivalent circuit implemented with elements other than an inductive element.

Here, an antenna structure may refer to a structure including one or more antennas. Furthermore, the antenna structure may include one or more capacitive elements or loads and may be implemented in a form in which one or more antennas or one or more capacitive elements may be connected or disposed in a specific manner.

Meanwhile, a plasma generating device according to one embodiment of the present specification may be widely used in various fields such as semiconductor, display processing, environment, and energy fields. The plasma generating device to be described below is not limited to being used only in a specific field and may be used in common in fields in which plasma is utilized.

Hereinafter, an ICP system 10 according to one embodiment of the present specification will be described with reference to FIGS. 1 and 2.

FIG. 1 is a diagram of a plasma system 10 according to one embodiment of the present specification. The plasma system 10 may induce ICP generation in a plasma generating unit by supplying RF power to an antenna structure using an RF power source.

Referring to FIG. 1, the plasma system 10 may include an RF power source 200 and a plasma generating device 100 including an antenna structure 1000 and a plasma generating unit 2000.

The plasma generating device 100 may generate plasma by receiving RF power from the RF power source 200. Specifically, when RF power is supplied to the antenna structure 1000, a time-varied current may flow, and on the basis of the time-varied current, the antenna structure 1000 may generate an induced electric field to induce plasma in the plasma generating unit 2000.

The antenna structure 1000 may be electrically connected to the RF power source 200. For example, the antenna structure 1000 may be connected in series or parallel with the RF power source 200 through a conducting wire or through an electrical element.

The antenna structure 1000 may be physically or electrically connected to the plasma generating unit 2000. A connection relationship between the antenna structure 1000 and the plasma generating unit 2000 will be described in detail below.

The plasma generating unit 2000 may include an area in which plasma generation is induced. For example, the plasma generating unit 2000 may refer to a space such as a chamber or a tube in which plasma may be generated and maintained.

Figure 2:
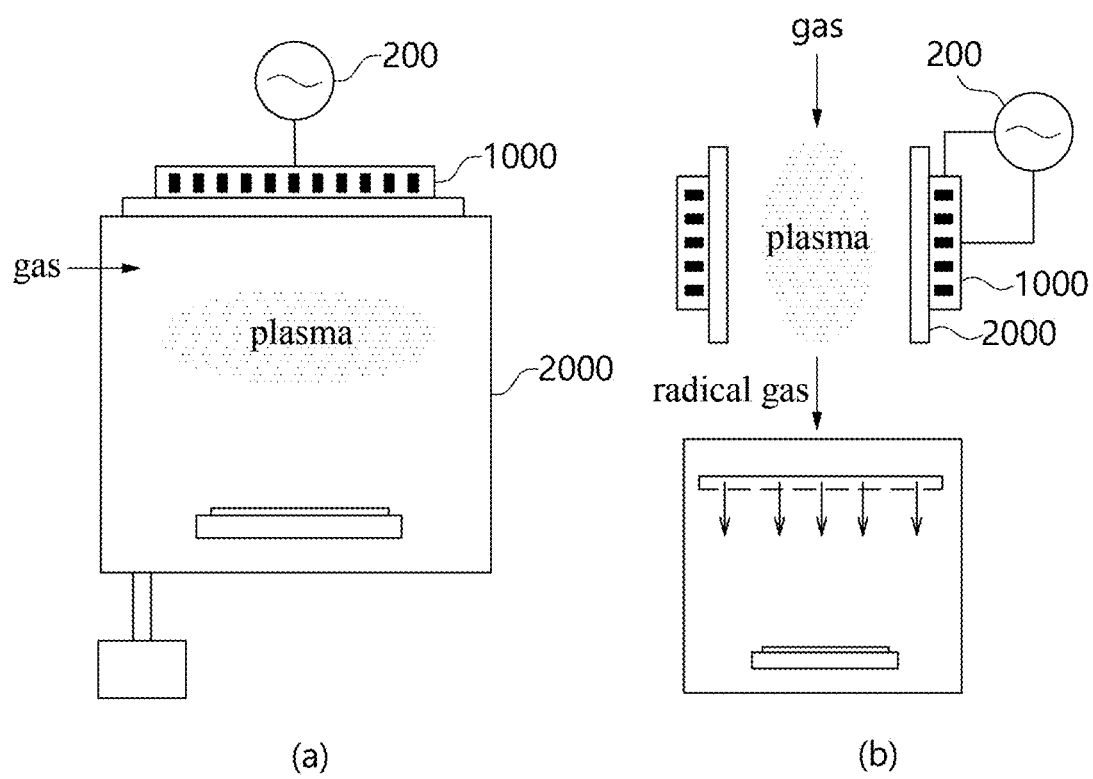
FIG. 2 shows diagrams of implementation examples of a plasma system according to one embodiment of the present specification.

FIG. 2 shows diagrams of implementation examples of a plasma system 10 according to one embodiment of the present specification.

Referring to FIG. 2, the plasma system 10 may be variously implemented according to a method in which plasma is used. Specifically, a positional relationship between an RF power source 200, an antenna structure 1000, and a plasma generating unit 2000 may be set according to a method in which plasma is used.

Referring to FIG. 2A, the plasma system 10 may generate plasma above or below the antenna structure 1000. For example, the antenna structure 1000 may be implemented as a plane type and disposed on a top of the plasma generating unit 2000, and the plasma generating unit 2000 may be provided as a chamber including an object to be processed such as a semiconductor wafer, a silicon substrate, or a display and may perform a semiconductor process or a display process using a process gas introduced into the plasma generating unit 2000 and plasma induced therein. For another example, the antenna structure 1000 may be implemented as a plane type and disposed on a bottom of the plasma generating unit 2000, and the plasma generating unit 2000 may be provided as a chamber including an object to be processed such as a semiconductor wafer, a silicon substrate, or a display and may perform a semiconductor process or a display process using a process gas introduced into the plasma generating unit 2000 and plasma induced therein.

Referring to FIG. 2B, the plasma system 10 may generate plasma in a central portion of an antenna structure 1000. For example, the antenna structure 1000 is implemented as a tube type and provided in a form which surrounds a plasma generating unit 2000 or is wound thereon, and the plasma generating unit 2000 may be provided as a dielectric tube and may generate a radical using plasma and a process gas supplied to the plasma generating unit 2000 and provide the radical to a separate process chamber.

Meanwhile, as shown in FIG. 2, the shape of the antenna structure 1000 is not limited to a plane shape or a tube shape, and of course, the antenna structure 1000 may be implemented as the tube type in FIG. 2A and the plane type in FIG. 2B.

Hereinafter, the plasma generating unit 2000 usable in the plasma system 10 will be described in detail with reference to FIG. 3.

Figure 3:
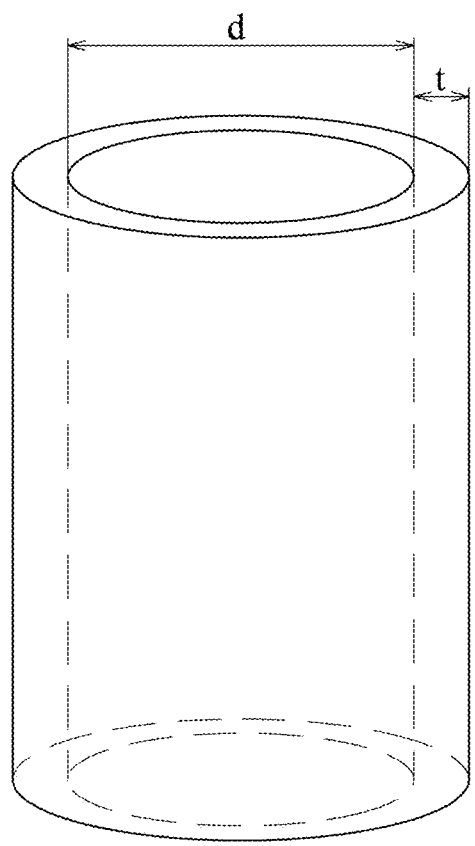
FIG. 3 is a diagram illustrating a plasma generating unit according to one embodiment of the present specification.

FIG. 3 is a diagram illustrating a plasma generating unit 2000 according to one embodiment of the present specification.

The plasma generating unit 2000 may be implemented in various shapes. For example, referring to FIG. 3, the plasma generating unit 2000 may be implemented in a shape including an inner space in which plasma is induced. Specifically, the plasma generating unit 2000 may have a shape such as a hollow cylinder shape, a ring shape, or a tube shape.

The plasma generating unit 2000 may have a specific thickness t. For example, referring to FIG. 3, when the plasma generating unit 2000 is implemented in a tube shape, the thickness t of the plasma generating unit 2000 may be determined within a range of 0.5 mm to 30 mm. Here, when the thickness t of the plasma generating unit 2000 is less than 0.5 mm, by-products may be easily generated in the plasma generating unit 2000 due to an antenna structure 1000, and physical durability may be weakened. Here, when the thickness t of the plasma generating unit 2000 is more than 30 mm, an inductive coupling between the antenna structure 1000 disposed around the plasma generating unit 2000 and plasma induced in the plasma generating unit 2000 may be weakened to make it difficult to induce or maintain plasma, and the cooling efficiency with respect to the plasma generating unit 2000 by the antenna structure 1000 to be described below may be lowered. Therefore, the above-described range of the thickness t of the plasma generating unit 2000 may have a critical significance in terms of, when the antenna structure 1000 is electrically coupled to the plasma generating unit 2000 as described below, being capable of stably inducing and maintaining plasma in the plasma generating unit 2000 and improving the durability of the plasma generating unit 2000.

The plasma generating unit 2000 may have a specific diameter d. For example, referring to FIG. 3, when the plasma generating unit 2000 has a tube shape, the diameter d may be determined within a range of 10 mm to 300 mm. Here, the diameter d may refer to a diameter of an inner surface of the plasma generating unit 2000, a diameter of an outer surface thereof, or an average diameter of the diameters of the inner and outer surfaces. Here, when the diameter d of the plasma generating unit 2000 is less than 10 mm, plasma induced in the plasma generating unit 2000 has a shape in which a surface area thereof is relatively greater as compared with a volume thereof, thereby resulting in energy loss. In addition, here, when the diameter d of the plasma generating unit 2000 is more than 300 mm, an induced power density required to induce plasma is very low, thereby causing a difficulty in manufacturing the antenna structure 1000, an RF power source 200, or the like. Therefore, the above-described range of the diameter d of the plasma generating unit 2000 may have a critical significance in terms of making it easier to manufacture the RF power source 200 and the antenna structure 1000 of the plasma system 10 and preventing plasma energy loss to improve efficiency of inducing plasma.

In the above, a case has been mainly described in which the shape of the plasma generating unit 2000 is a hollow cylinder shape or a tube shape, but the technical idea of the present specification is not limited thereto. For example, the plasma generating unit 2000 may have a polygonal shape including an inner space in which plasma can be induced, and even in this case, of course, the above-described contents of the thickness t and the diameter d can be applied.

The plasma generating unit 2000 may be made of various materials. For example, the plasma generating unit 2000 may be made of a non-conductor. For another example, the plasma generating unit 2000 may be made of a material having high thermal conductivity. Specifically, the plasma generating unit 2000 may be made of aluminum nitride (AlN), aluminum oxide ($Al_2O_3$), silicon nitride (SiN), silicon nitride ($Si_3N_4$), silicon dioxide ($SiO_2$), yttrium oxide ($Y_2O_3$), or silicon carbide (SiC).

Furthermore, the plasma generating unit 2000 may be made of a material that does not generate impurities through a reaction with a gas (for example, $NF_3$, Ar, $CO_2$, $CH_4$, $NF_3$, $O_2$, or $H_2$), which is introduced into the plasma generating unit 2000 so as to induce plasma. For example, the plasma generating unit 2000 may be made of silicon carbide (SiC).

Hereinafter, an RF power source will be described in detail with reference to FIG. 4.

Figure 4:
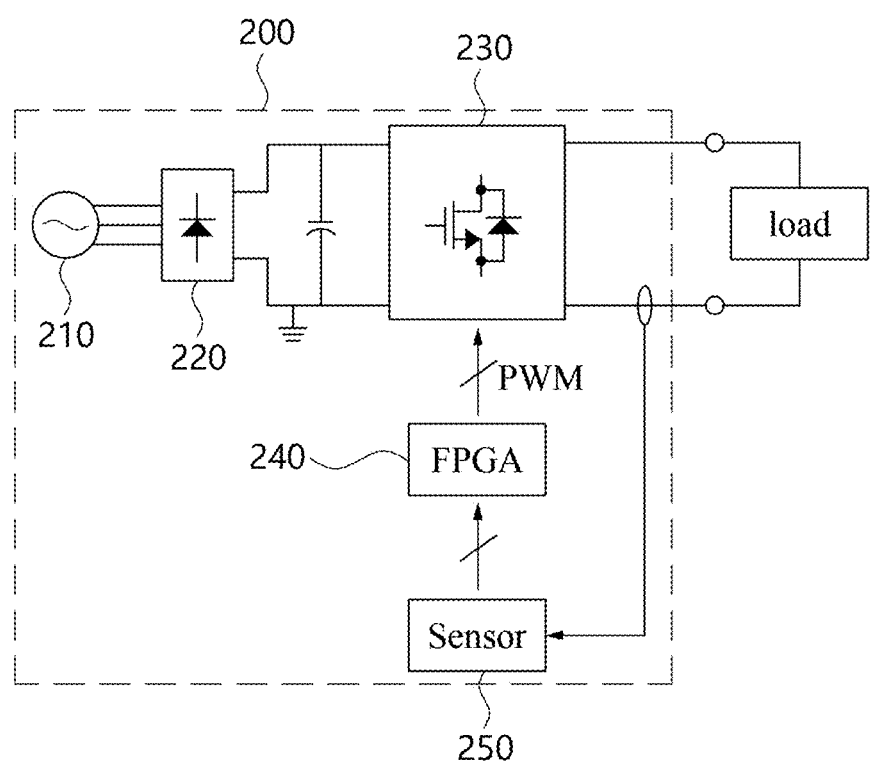
FIG. 4 is a diagram of a radio frequency (RF) power source according to one embodiment of the present specification.

FIG. 4 is a diagram of an RF power source 200 according to one embodiment of the present specification.

Referring to FIG. 4, the RF power source 200 may include an AC power source 210, a rectifier 220, an inverter 230, a controller 240, and a sensor module 250. The RF power source 200 may convert first AC power supplied from the AC power source 210 into second AC power to supply the second AC power to a load. For example, the RF power source 200 may convert the first AC power used in a typical home or industry into the second AC power having a frequency of several hundred kHz to several ten MHz and having several kW or more to supply the second AC power to an antenna structure 1000.

Here, the load may include the antenna structure 1000 and plasma generated by the antenna structure 1000.

The rectifier 220 may convert an output of the AC power source 210 into DC power. For example, the rectifier 220 may convert the first AC power supplied from the AC power source 210 into DC power to apply the DC power to both ends of the inverter 230.

The inverter 230 may receive DC power from the rectifier 220 to supply the second AC power to the load. In this case, the inverter 230 may supply the second AC power to the load using a switching signal received from the controller 240. Here, the inverter 230 may include at least one switch element controlled by a switching signal, and the second AC power supplied from the inverter 230 to the load may have a driving frequency set based on a switching signal supplied to the inverter 230 from the controller 240. To this end, the inverter 230 may be provided as a half bridge type or a full bridge type controlled through a pulse width modulation (PWM) method.

Meanwhile, a capacitive element may be disposed between the rectifier 220 and the inverter 230. For example, the RF power source 200 may include a capacitor connected in parallel with the rectifier 220 and the inverter 230, and the capacitor may discharge an AC component of power applied to the inverter 230 to a ground node GND.

The controller 240 may generate a switching signal by receiving sensing data from the sensor module 250. For example, the controller 240 may include a field-programmable gate array (FPGA) and may generate a switching signal by acquiring data related to a resonant frequency of the load from the sensor module 250.

The sensor module 250 may acquire data about a resonant frequency of the load or data about power supplied to the load for the controller 240. To this end, the sensor module

250 may detect a magnitude and phase of a current flowing in the load or the inverter 230, a magnitude and phase of a voltage applied thereto, a relative potential, or a power magnitude.

As described above, the RF power source 200 may control a driving frequency of the second AC power supplied to the load based on data about a resonant frequency of the load. In other words, the RF power source 200 may set the driving frequency of the second AC power so as to be similar to the resonance frequency of the load by tracking the resonance frequency of the load which is changed according to plasma generation. Accordingly, it is possible to prevent unnecessary power consumption and improve the durability of a plasma system.

Hereinafter, a configuration and arrangement method of the antenna structure 1000 will be described with reference to FIGS. 5 and 6.

Figure 5:
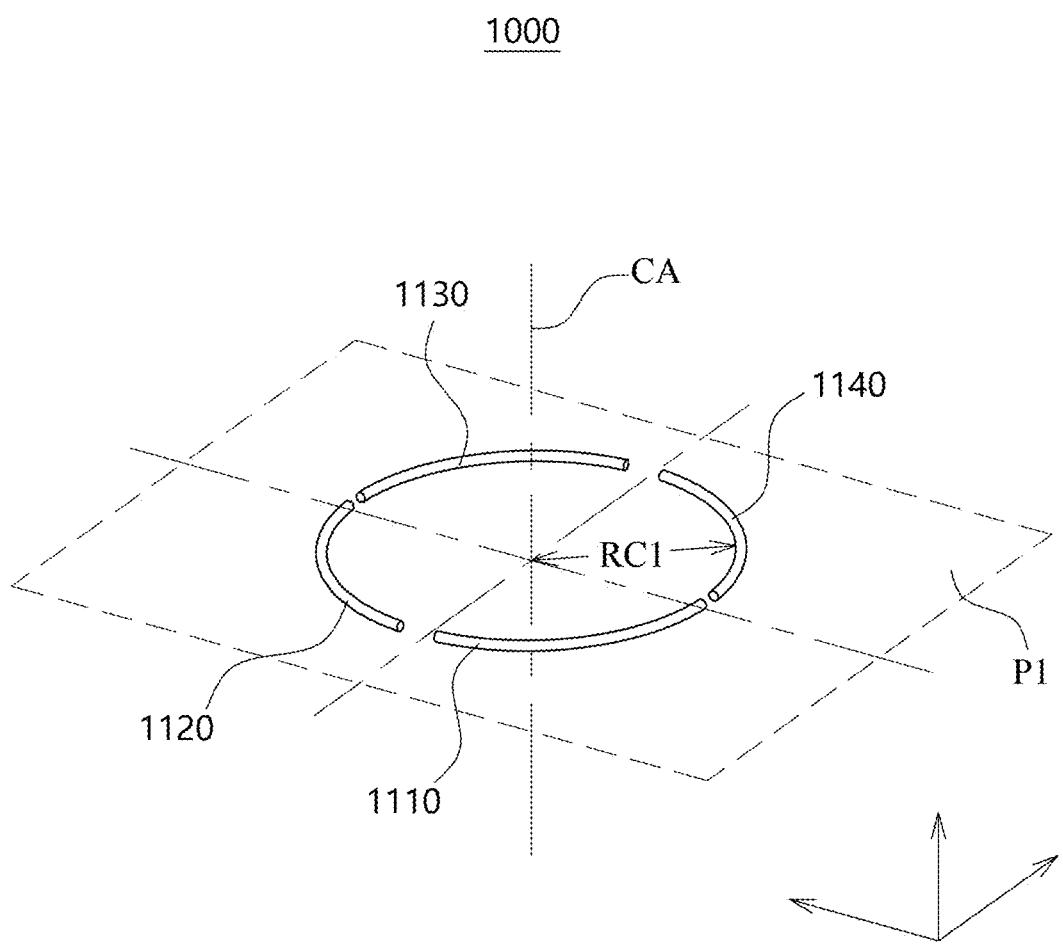
FIGS. 5 and 6 are diagrams of a method of arranging antenna segments according to one embodiment of the present specification.
Figure 6:
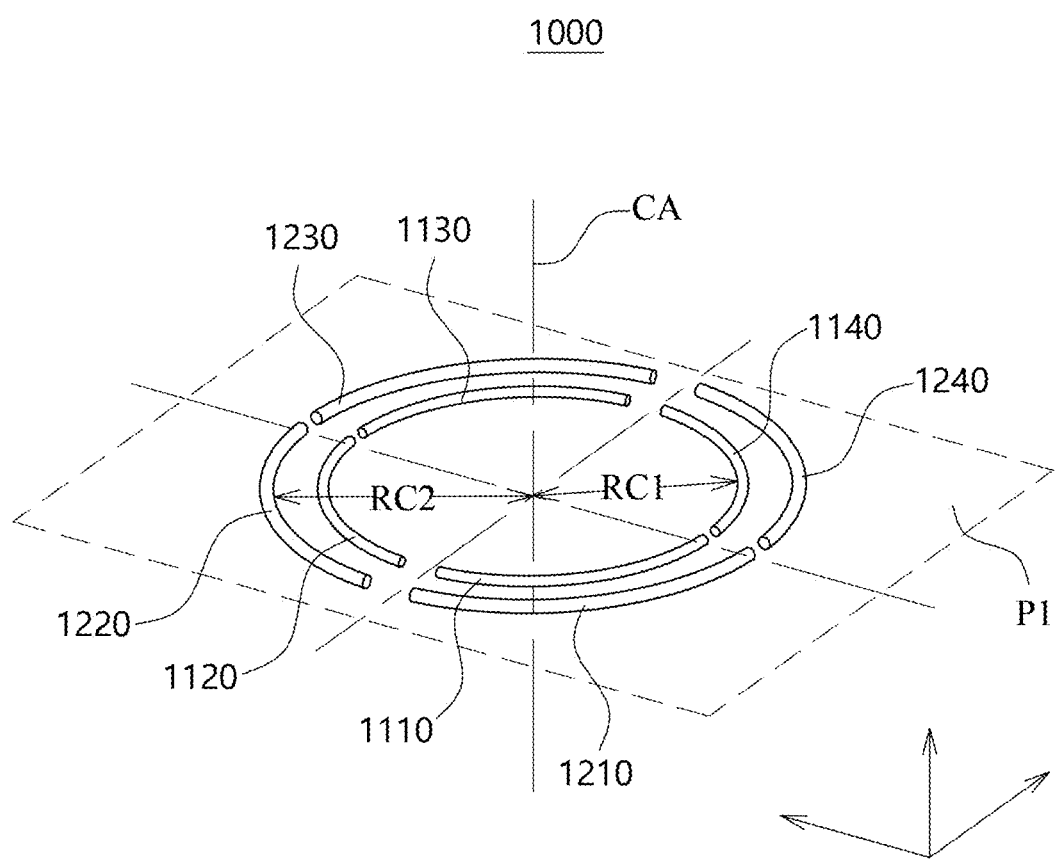

FIGS. 5 and 6 are diagrams of a method of arranging antenna segments according to one embodiment of the present specification.

Referring to FIG. 5, an antenna structure 1000 may include the plurality of antenna segments. The antenna structure 1000 may be provided with the plurality of antenna segments according to the intensity, density, or generation range of plasma required in a plasma application field. For example, the antenna structure 1000 may be disposed in a wide area so as to supply plasma in a wide range, and in this case, in order to prevent a potential of the antenna structure 1000 from being increased due to an excessive increase in length of the antenna structure 1000, the antenna structure 1000 may be divided into the plurality of antenna segments.

Hereinafter, for convenience of description, it will be described that the antenna segments include first to fourth antenna segments 1110, 1120, 1130, and 1140, but the antenna structure 1000 may include m antenna segments (wherein m is a natural number). The following descriptions may be applied in common to each case.

The antenna segment may be provided as an antenna, a part of an induction coil or inductor, a copper wire, or the like. Physical properties such as a cross-sectional shape, a cross-sectional area, a thickness, and a width of the antenna segment may be determined based on electrical properties required for the antenna structure 1000 or the antenna segment, such as inductance, mutual inductance, parasitic inductance, capacitance, parasitic capacitance, resistance, or parasitic resistance.

In addition, hereinafter, for convenience of description, it is assumed that the antenna segment has an arc shape, but the technical idea of the present specification is not limited thereto. In addition to the arc shape, the antenna segment may have a specific figure shape such as a straight line, curve, broken straight line, broken curve, circle, polygon, donut, or solenoid shape and may be generally implemented in a three-dimensional shape. Of course, the antenna segment may be implemented in a two-dimensional shape such as a thin film or a plating.

The antenna segment may have a predetermined distance from a central axis CA and may be disposed on a first plane P1. Specifically, the antenna segment may be disposed on the first plane P1 and may be spaced apart from the central axis CA by a preset distance.

Here, the central axis CA may refer to a virtual axis. For example, the central axis CA may be understood as a virtual straight line passing through a center of plasma generated in a plasma system 10.

Here, the first plane P1 may refer to a virtual plane on which the antenna segment is disposed. For example, the first plane P1 may refer to a virtual plane perpendicular to the central axis CA. For another example, the first plane P1 may refer to a virtual plane that intersects the central axis CA. Meanwhile, all of the antenna segments may be disposed on the first plane P1, at least some thereof may be disposed on the first plane P1, and others thereof may be disposed on a different plane from the first plane P1.

The antenna segment may have a specific curvature or a specific radius of curvature. For example, the first to fourth antenna segments 1110, 1120, 1130, and 1140 may be implemented in an arc shape having a first radius of curvature RC1. For another example, the first to fourth antenna segments 1110, 1120, 1130, and 1140 may have curvatures or radii of curvature corresponding to each other. For still another example, the first to fourth antenna segments 1110, 1120, 1130, and 1140 may have different curvatures or different radii of curvature.

Here, a radius of curvature or a curvature may be set based on the size of the antenna structure 1000. For example, as the size or volume of the antenna structure 1000 is increased, a radius of curvature may be increased, and a curvature may be decreased.

The antenna segment may extend by a specific length. For example, the first to fourth antenna segments 1110, 1120, 1130, and 1140 may be disposed to extend by lengths corresponding to each other or extend by different lengths. Specifically, the first to fourth antenna segments 1110, 1120, 1130, and 1140 may have the same first length or different lengths.

The total length of the antenna segments may be set to be less than or equal to a preset value. For example, when, with respect to the central axis CA on the first plane P1, the first to fourth antenna segments 1110, 1120, 1130, and 1140 have the first radius of curvature RC1 and are disposed to extend by the first length, the sum of lengths of the first to fourth antenna segments 1110, 1120, 1130, and 1140 may be less than a length of a circumference of a circle having the first radius of curvature RC1 as a radius. For another example, when, with respect to the central axis CA on the first plane P1, at least some of the first to fourth antenna segments 1110, 1120, 1130, and 1140 have the first radius of curvature RC1 and are disposed to extend by the first length, and others thereof have a second radius of curvature RC2 and are disposed to extend by a second length, the sum of the lengths of the first to fourth antenna segments 1110, 1120, 1130, and 1140 may be less than a length of a circumference of a circle having the first radius of curvature RC1 or the second radius of curvature RC2 as a radius. In this case, the first to fourth antenna segments 1110, 1120, 1130, and 1140 may be disposed so as to not be in physical contact with each other.

Meanwhile, electrical elements may be disposed between the antenna segments. For example, capacitive elements may be disposed between the antenna segments and may electrically connect the antenna segments. The arrangement of the electrical elements will be described in detail below.

Antenna segments included in the antenna structure 1000 may be disposed in a plurality of turns. Referring to FIG. 6, the antenna segments may be disposed in two turns on a first plane P1 with respect to a central axis CA. Specifically, a first turn may include first to fourth antenna segments 1110, 1120, 1130, and 1140, and a second turn may include fifth to eighth antenna segments 1210, 1220, 1230, and 1240. Here, the antenna segment of the first turn may have a first radius of curvature RC1, and the antenna segment of the second turn may have a second radius of curvature RC2 that is greater than the first radius of curvature RC1.

Each of the antenna segments of the second turn may be disposed to correspond to each of the antenna segments of the first turn. For example, when the first to fourth antenna segments 1110, 1120, 1130, and 1140 are respectively disposed in first to fourth quadrants of the first plane P1, the fifth to eighth antenna segments 1210, 1220, 1230, and 1240 may be disposed in the first to fourth quadrants of the first plane P1, respectively.

Here, the first antenna segment 1110 may be adjacent to the second antenna segment 1120 and the fourth antenna segment 1140 in an arc direction and may be adjacent to the fifth antenna segment 1210 in a direction perpendicular to the central axis CA. The second antenna segment 1120 may be adjacent to the first antenna segment 1110 and the third antenna segment 1130 in an arc direction and may be adjacent to the sixth antenna segment 1220 in a direction perpendicular to the central axis CA. The third antenna segment 1130 may be adjacent to the second antenna segment 1120 and the fourth antenna segment 1140 in an arc direction and may be adjacent to the seventh antenna segment 1230 in a direction perpendicular to the central axis CA. The fourth antenna segment 1140 may be adjacent to the first antenna segment 1110 and the third antenna segment 1130 in an arc direction and may be adjacent to the eighth antenna segment 1240 in a direction perpendicular to the central axis CA.

The antenna segment of the second turn may extend by a length that is greater than that of the antenna segment of the first turn. For example, when the first antenna segment 1110 is disposed to extend by a first length, the fifth antenna segment 1210 may extend by a second length greater than the first length. Here, a ratio of the second length to the first length may correspond to a ratio of the second radius of curvature RC2 of the fifth antenna segment 1210 to the first radius of curvature RC1 of the first antenna segment 1110. In addition, here, a central angle formed by the central axis CA and the first antenna segment 1110 extending by the corresponding first length may correspond to a central angle formed by the central axis CA and the fifth antenna segment 1210 extending by the second length. Alternatively, a central angle of a sector having the first antenna segment 1110 extending by the first length as an arc may correspond to a size of a central angle of a sector having the fifth antenna segment 1210 extending by the second length as an arc. Alternatively, an extension line connecting one end of the first antenna segment 1110 and one end of the fifth antenna segment 1210 may meet the central axis CA.

Here, a central angle may be set according to the number of antenna segments disposed per turn. For example, when x antenna segments are disposed per turn (wherein x is a natural number), a central angle formed by each antenna segment and the central axis CA may be less than or equal to about $(360/x)°$. Specifically, referring again to FIG. 5, antenna segments may include the first to fourth antenna segments 1110 to 1140, and in this case, a central angle formed by each antenna segment and the central axis CA may be less than or equal to about 90°.

A distance between the first turn and the second turn may be set based on the electrical properties of the antenna structure 1000. As an example, the distance between the first turn and the second turn may be set based on a parasitic capacitance that may occur between the antenna segments. For example, the distance between the first turn and the second turn may be set as a distance at which the influence of a parasitic capacitance is minimized between the first antenna segment 1110 and the fifth antenna segment 1210 when power is applied to the antenna structure 1000. For another example, the distance between the first turn and the second turn may be set in consideration of the total volume of the antenna structure 1000. For example, in order to reduce a width of the antenna structure 1000 within a range of manufacturing tolerance, the distance between the first turn and the second turn may be set at about 1 mm or within a range of 0.5 mm to 3.5 mm. In this case, the distance between the first turn and the second turn may be set as a distance at which arcing between the turns does not occur when the plasma system 10 is driven at a specific driving frequency. For another example, the distance between the first turn and the second turn may be set in consideration of the flexibility of a plasma generating unit 2000. Of course, the above-described method of setting the distance between the first turn and the second turn may also be used to set a distance between turns in the antenna structure 1000, such as a distance between the second turn and a third turn.

An inductance of the antenna segment of the second turn may be set based on an inductance of the antenna segment of the first turn. For example, an inductance of the fifth antenna segment 1210 may correspond to an inductance of the first antenna segment 1110. For another example, the inductance of the fifth antenna segment 1210 may be set to be greater than the inductance of the first antenna segment 1110.

Meanwhile, the antenna segments of the first turn and the second turn may be disposed on different planes. For example, the antenna segment of the first turn may be disposed on the first plane P1, and the antenna segment of the second turn may be disposed on a plane parallel to the first plane P1 or a plane forming a predetermined angle with the first plane P1.

In addition, the first turn and the second turn may include the same number of antenna segments or different numbers of antenna segments. For example, the first turn may include four first to fourth antenna segments 1110, 1120, 1130, and 1140, and the second turn may include only the fifth and seventh antenna segments 1210 and 1230 which are disposed to be symmetrical with respect to the central axis CA.

In the above, for convenience of description, the descriptions have been given based on the antenna structure 1000 being implemented with two turns, but the technical idea of the present specification is not limited thereto. The antenna structure 1000 may be implemented with n turns (wherein n is a natural number). Furthermore, the antenna structure 1000 may include n turns including m antenna segments. The above-described method of arranging the antenna segments may be similarly applied to the case of the antenna structure 1000 including the plurality of segments and the plurality of turns as described above. For example, when the antenna structure 1000 is implemented with three turns each including six antenna segments, a first turn may include six antenna segments having the first radius of curvature RC1 and the first length, a second turn may include six antenna segments having the second radius of curvature RC2 and the second length, and a third turn may include six antenna segments having a third radius of curvature and a third length. In addition, the sum of the lengths of the antenna segments in each turn may be less than a circumference of a circle having the radius of curvature of the antenna segments in each turn as a radius.

Hereinafter, a method of connecting the antenna segments in the antenna structure 1000 will be described with reference to FIGS. 7 to 10.

FIGS. 7 to 10 are diagrams of an antenna structure 1000 including antenna segments and capacitive elements according to one embodiment of the present specification.

Figure 7:
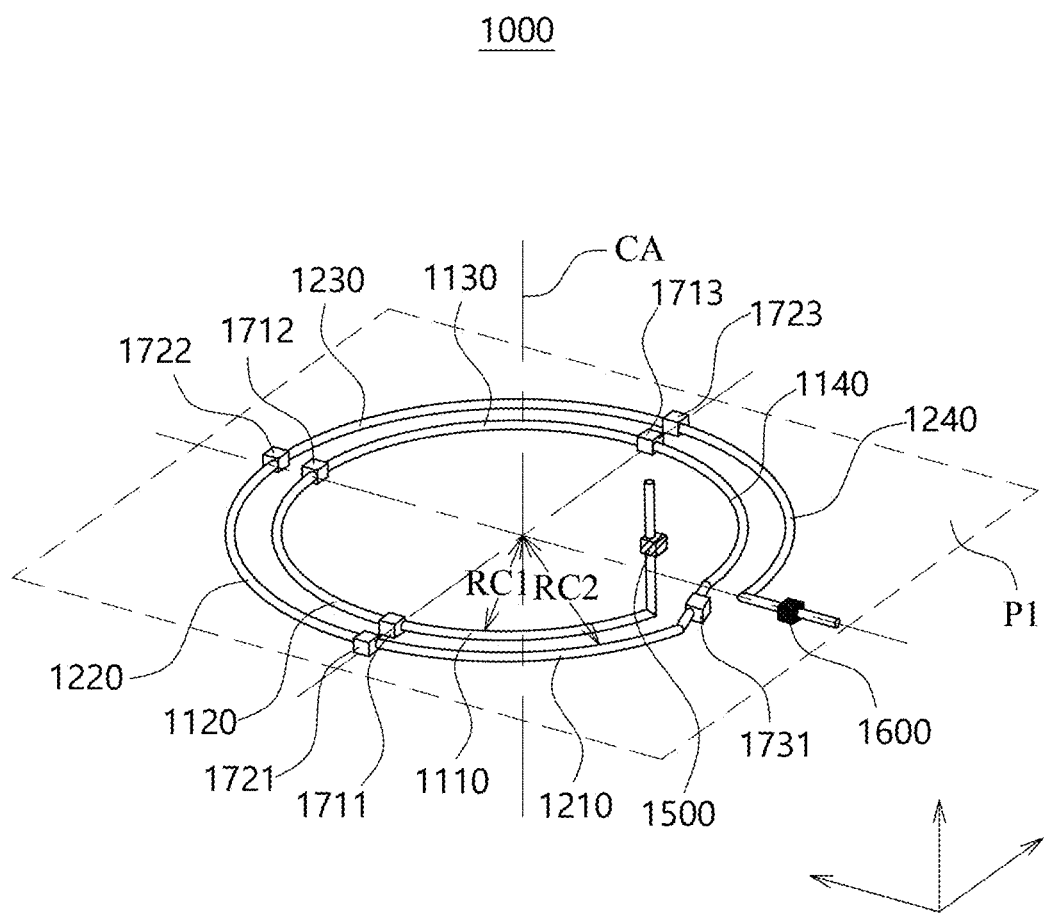
FIGS. 7 to 10 are diagrams of an antenna structure including antenna segments and capacitive elements according to one embodiment of the present specification.

Referring to FIG. 7, the antenna structure 1000 may be implemented as a plane type and may include the antenna segments, a first main capacitive element 1500, a second main capacitive element 1600, and auxiliary capacitive elements. Since the antenna structure 1000 includes the auxiliary capacitive elements, the plurality of antenna segments may be electrically or physically connected and may be connected to an RF power source 200 through the first main capacitive element 1500 and the second main capacitive element 1600.

Here, the auxiliary capacitive elements may include first to sixth auxiliary capacitive elements 1711, 1712, 1713, 1721, 1722, and 1723 which electrically or physically connect the antenna segments in turns and a first turn-to-turn capacitive element 1731 which electrically or physically connects different turns.

Here, the main capacitive elements 1500 and 1600 and the auxiliary capacitive elements may be capacitors or elements expressed as an equivalent circuit of a capacitor and may refer to elements having predetermined capacitance or capacitive reactance. For example, the main capacitive elements 1500 and 1600 and the auxiliary capacitive elements may include ceramic capacitors having excellent high frequency characteristics or multi-layer ceramic capacitors (MLCCs) or capacitor arrays in which a plurality of capacitors are connected in series and/or parallel.

The auxiliary capacitive elements may electrically or physically connect the plurality of antenna segments. For example, referring again to FIG. 7, one end of the first auxiliary capacitive element 1711 may be connected to one end of a first antenna segment 1110, and the other end of the first auxiliary capacitive element 1711 may be connected to one end of a second antenna segment 1120. The first antenna segment 1110 may extend from one end of the first auxiliary capacitive element 1711 by a first length with a first radius of curvature RC1, and the second antenna segment 1120 may extend from the other end of the first auxiliary capacitive element 1711 by the first length with the first radius of curvature RC1.

For another example, the first antenna segment 1110 may extend from one end of the first auxiliary capacitive element 1711 by the first length with the first radius of curvature RC1, and the second antenna segment 1120 may extend from the other end of the first auxiliary capacitive element 1711 by the first length with a second radius of curvature RC2. In this case, the first radius of curvature RC1 and the second radius of curvature RC2 may be the same or different.

For still another example, the first antenna segment 1110 may extend from one end of the first auxiliary capacitive element 1711 by the first length with the first radius of curvature RC1, and the second antenna segment 1120 may extend from the other end of the first auxiliary capacitive element 1711 by a second length with the first radius of curvature RC1. In this case, the first length and the second length may be the same or different.

The auxiliary capacitive element may be disposed between the antenna segments. For example, referring again to FIG. 7, the first to third auxiliary capacitive elements 1711, 1712, and 1713 may be disposed between first to fourth antenna segments 1110, 1120, 1130, and 1140 in a first turn of the antenna structure 1000. The first auxiliary capacitive element 1711 may be disposed between the first antenna segment 1110 and the second antenna segment 1120. The second auxiliary capacitive element 1712 may be disposed between the second antenna segment 1120 and the third antenna segment 1130. The third auxiliary capacitive element 1713 may be disposed between the third antenna segment 1130 and the fourth antenna segment 1140. The fourth to sixth auxiliary capacitive elements 1721, 1722, and 1723 may be disposed between fifth to eighth antenna segments 1210, 1220, 1230, and 1240 in a second turn of the antenna structure 1000. The fourth auxiliary capacitive element 1721 may be disposed between the fifth antenna segment 1210 and the sixth antenna segment 1220. The fifth auxiliary capacitive element 1722 may be disposed between the sixth antenna segment 1220 and the seventh antenna segment 1230. The sixth auxiliary capacitive element 1723 may be disposed between the seventh antenna segment 1230 and the eighth antenna segment 1240.

Here, the first auxiliary capacitive element 1711 may be disposed adjacent to the second auxiliary capacitive element 1712 in an arc direction and may be disposed adjacent to the fourth auxiliary capacitive element 1721 in a direction perpendicular to a central axis CA. The second auxiliary capacitive element 1712 may be disposed adjacent to the first auxiliary capacitive element 1711 and the third auxiliary capacitive element 1713 in an arc direction and may be disposed adjacent to the fifth auxiliary capacitive element 1722 in a direction perpendicular to the central axis CA. The third auxiliary capacitive element 1713 may be disposed adjacent to the second auxiliary capacitive element 1712 in an arc direction and may be disposed adjacent to the sixth auxiliary capacitive element 1723 in a direction perpendicular to the central axis CA.

The auxiliary capacitive element may be disposed to have a specific positional relationship with the antenna segments. For example, the first auxiliary capacitive element 1711 may be disposed to pass through a virtual line connecting the other end of the first antenna segment 1110 and one end of the second antenna segment 1120. For another example, the first auxiliary capacitive element 1711 may be connected to the first antenna segment 1110 and the second antenna segment 1120 through an electrical connecting member such as a conducting wire and may be disposed to be spaced further apart from the central axis CA than the antenna segments connected thereto. For still another example, the first auxiliary capacitive element 1711 may be disposed between the first turn and the second turn. Specifically, the first auxiliary capacitive element 1711 may be disposed to be spaced apart from the central axis CA by a distance that is greater than the first radius of curvature RC1 and less than the second radius of curvature RC2.

Alternatively, the auxiliary capacitive element may be disposed on a plane different from a plane on which the antenna segment is disposed. For example, at least one of the first to sixth auxiliary capacitive elements 1711, 1712, 1713, 1721, 1722, and 1723 may be disposed to be spaced apart from a first plane P1 by a preset distance. Here, the preset distance may be set in consideration of the volume, size, or the like of the auxiliary capacitive element.

The auxiliary capacitive elements may be disposed to have a preset positional relationship with each other between the antenna segments. For example, referring again to FIG. 7, at least two of the first to sixth auxiliary capacitive elements 1711, 1712, 1713, 1721, 1722, and 1723 may be disposed to be symmetrical with respect to the central axis CA. Specifically, the first auxiliary capacitive element 1711 and the third auxiliary capacitive element 1713 may be symmetrical with respect to the central axis CA. For another example, the auxiliary capacitive element of the first turn and the auxiliary capacitive element of the second turn may be disposed at positions corresponding to each other. Specifically, an extension line connecting the first auxiliary capacitive element 1711 and the fourth auxiliary capacitive element 1721 may meet the central axis CA. Alternatively, the extension line connecting the first auxiliary capacitive element 1711 and the fourth auxiliary capacitive element 1721 may pass through the third auxiliary capacitive element 1713 and the sixth auxiliary capacitive element 1723. Alternatively, the extension line connecting the first auxiliary capacitive element 1711 and the fourth auxiliary capacitive element 1721 and an extension line connecting the second auxiliary capacitive element 1712 and the fifth auxiliary capacitive element 1722 may meet within a preset range from the central axis CA or may be at skew positions.

The first to fourth antenna segments 1110, 1120, 1130, and 1140 may be electrically connected through the first to third auxiliary capacitive elements 1711, 1712, and 1713 in a similar manner as that described above. In addition, the fifth to eighth antenna segments 1210, 1220, 1230, and 1240 may be electrically connected through the fourth to sixth auxiliary capacitive elements 1721, 1722, and 1723.

The number of the auxiliary capacitive elements may be set based on the number of layers, the number of turns, and the number of antenna segments in the antenna structure 1000. For example, referring again to FIG. 7, when the antenna structure 1000 is provided as one layer including two turns each having four antenna segments, the antenna structure 1000 may include seven auxiliary capacitive elements.

Meanwhile, a plurality of turns constituting the antenna structure 1000 may include different numbers of antenna segments. As an example, referring to FIG. 8, the antenna structure 1000 may include a first turn including first to fourth antenna segments 1110, 1120, 1130, and 1140 and a second turn including fifth to tenth antenna segments 1210, 1220, 1230, 1240, 1250, and 1260.

Here, the antenna segments in the antenna structure 1000 may have substantially the same length or different lengths. For example, all of the antenna segments of the first turn and the antenna segments of the second turn may have the same length. For another example, each of the antenna segments of the first turn may have a first length, and each of the antenna segments of the second turn may have a second length less than the first length. In this case, the first length and the second length may be set based on a radius of curvature of each turn. Here, the antenna segments constituting each turn of the antenna structure 1000 do not necessarily extend by the same length.

Meanwhile, when the plurality of turns constituting the antenna structure 1000 include different numbers of antenna segments, the turns in the antenna structure 1000 may include different numbers of auxiliary capacitive elements. As an example, referring again to FIG. 8, the first turn of the antenna structure 1000 may include first to third auxiliary capacitive elements 1711, 1712, and 1713, and the second turn thereof may include fourth to eighth auxiliary capacitive elements 1721, 1722, 1723, 1724, and 1725.

Here, the auxiliary capacitive element included in the first turn of the antenna structure 1000 and the auxiliary capacitive element included in the second turn thereof may have a preset positional relationship. Specifically, at least one of the auxiliary capacitive elements included in the first turn and at least one of the auxiliary capacitive elements included in the second turn may be positioned on a straight line. For example, referring again to FIG. 8, the second auxiliary capacitive element 1712 of the first turn of the antenna structure 1000 and the sixth auxiliary capacitive element 1723 of the second turn thereof may be disposed within an area preset from a straight line that is perpendicular to a central axis CA and passes through a center of the antenna structure 100. However, a positional relationship between the auxiliary capacitive elements in the antenna structure 1000 is not limited to the above-described case, and the auxiliary capacitive elements in the antenna structure 1000 may be arbitrarily disposed irrespective of a specific positional relationship with each other.

The plurality of layers constituting the antenna structure 1000 may include different numbers of antenna segments and different numbers of auxiliary capacitive elements. The numbers of the antenna segments and the numbers of the auxiliary capacitive elements included in different layers may be set through a method similar to the above-described method of setting the numbers of the antenna segments and the numbers of the auxiliary capacitive elements included in different turns.

The auxiliary capacitive element may be disposed between the turns to electrically or physically connect the antenna segments. For example, referring again to FIG. 7, the auxiliary capacitive element may be disposed between the first turn and the second turn to electrically connect the first turn and the second turn. Specifically, the first turn-to-turn capacitive element 1731 may serially connect the fourth antenna segment 1140 constituting the first turn and the fifth antenna segment 1210 constituting the second turn. In this case, the first turn-to-turn capacitive element 1731 may be connected to the antenna segment directly or through a separate connecting member such as a conducting wire, and thus, the antenna segment connected to the first turn-to-turn capacitive element 1731 may be shorter or longer than other antenna segments. Although not shown, the first turn-to-turn capacitive element 1731 may serially connect the first antenna segment 1110 constituting the first turn and the eighth antenna segment 1240 constituting the second turn. In this case, the antenna structure 1000 may be wound counterclockwise from an inner turn to an outer turn in a direction from the first plane P1 to a second plane P2.

Here, in order to connect the turns, the turn-to-turn capacitive element may have a different shape from other auxiliary capacitive elements or may include a separate connecting member. For example, one end and the other end of the first turn-to-turn capacitive element 1731 may be spaced apart from the central axis CA by different distances. Specifically, one end of the first turn-to-turn capacitive element 1731 connected to the fourth antenna segment 1140 of the first turn may have a shorter distance from the central axis CA than the other end of the first turn-to-turn capacitive element 1731 connected to the fifth antenna segment 1210 of the second turn. For another example, the first turn-to-turn capacitive element 1731 may include a first connecting member extending from one end of the first turn-to-turn capacitive element 1731 to the fourth antenna segment 1140 and a second connecting member extending from the other end of the first turn-to-turn capacitive element 1731 to the fifth antenna segment 1210. In this case, the first connecting member and the second connecting member may include a straight or curved conducting wire and may be spaced apart from the central axis CA by different distances.

Since the antenna structure 1000 includes the turn-to-turn capacitive element, all the antenna segments in the antenna structure 1000 may be electrically connected.

The main capacitive elements 1500 and 1600 may physically or electrically connect the antenna segments and the RF power source 200. For example, referring again to FIG. 7, the first main capacitive element 1500 may electrically connect the first antenna segment 1110 and a first terminal of an inverter 230, and the second main capacitive element 1600 may electrically connect the eighth antenna segment 1240 and a second terminal of the inverter 230.

Alternatively, unlike that shown in FIG. 7, the first main capacitive element 1500 may electrically connect the fourth antenna segment 1140 and the first terminal of the inverter 230, and the second main capacitive element 1600 may electrically connect the fifth antenna segment 1210 and the second terminal of the inverter 230.

Meanwhile, when the antenna structure 1000 is implemented with the first turn including the first to fourth antenna segments 1110, 1120, 1130, and 1140, one of the first antenna segment 1110 and the fourth antenna segment 1140 may be electrically connected to the first terminal of the inverter 230 through the first main capacitive element 1500, and the other thereof may be electrically connected to the second terminal of the inverter 230 through the second main capacitive element 1600.

The main capacitive elements 1500 and 1600 may have a specific shape or include a separate connecting member so as to connect the RF power source 200 and the antenna structure 1000. For example, the first main capacitive element 1500 may extend from one end of the first antenna segment 1110 in a direction parallel to the central axis CA. Alternatively, the first main capacitive element 1500 may extend from one end of the first antenna segment 1110 in a direction away from the central axis CA. Alternatively, the first main capacitive element 1500 may be disposed such that at least a portion of the first main capacitive element 1500 may overlap the first turn-to-turn capacitive element 1173 and at least a portion of the antenna segment when viewed in a direction perpendicular to the first plane P1. The second main capacitive element 1600 may extend from the other end of the eighth antenna segment 1240 so as to be parallel to the first plane P1. Alternatively, the second main capacitive element 1600 may extend from the other end of the eighth antenna segment 1240 in a direction parallel to the central axis CA.

Meanwhile, at least one of the first main capacitive element 1500 and the second main capacitive element 1600 may be omitted from the antenna structure 1000. In this case, the RF power source 200 may provide an electrical element corresponding to the main capacitive elements 1500 and 1600. In addition, at least some of the auxiliary capacitive elements may be omitted.

Furthermore, the main capacitive elements 1500 and 1600 and the auxiliary capacitive elements may be disposed to be spaced apart from the antenna segments by a predetermined distance. For example, when the size or volume of the auxiliary capacitive element is great, the auxiliary capacitive element may be connected to the antenna segment through a separate connecting member such as a conductor or a conducting wire in a state of being spaced apart from the antenna segment by a predetermined distance.

A direction in which a current flows in the antenna structure 1000 may be determined according to a method of connecting the main capacitive elements 1500 and 1600, the auxiliary capacitive elements, and the antenna segments. For example, referring again to FIG. 7, when the first main capacitive element 1500 is connected in series to the first antenna segment 1110, the fourth antenna segment 1140 and the fifth antenna segment 1210 are connected in series through the first turn-to-turn capacitive element 1731, and the second main capacitive element 1600 is connected in series to the eighth antenna segment 1240, and when power is applied to the antenna structure 1000, a current may flow in the first turn and the second turn in the same direction (clockwise or counterclockwise). For another example, unlike that shown in FIG. 6, when the first main capacitive element 1500 is connected in series to the fourth antenna segment 1140, the first antenna segment 1110 and the eighth antenna segment 1210 are connected in series through the first turn-to-turn capacitive element 1731, and the second main capacitive element 1600 is connected in series to the fifth antenna segment 1210, and when power is applied to the antenna structure 1000, a current may flow in the first turn and the second turn in the same direction (clockwise or counterclockwise). In this case, when a current flows in the first turn and the second turn in the same direction, an intensity of an induced electric field for plasma generation may be increased as compared with a case in which a current flows in the first turn and the second turn in different directions, and a potential difference between the antenna segments may be reduced, thereby reducing the influence of a parasitic capacitor.

The antenna structure 1000 may generate plasma by receiving an AC signal having a variable driving frequency from the RF power source 200 through the main capacitive elements 1500 and 1600.

Here, the driving frequency of the AC signal applied to the antenna structure 1000 may be time-varying based on a resonance frequency of a load including the antenna structure 1000 and the plasma.

The auxiliary capacitive element may have predetermined electric capacity or capacitance. For example, the capacitance of the auxiliary capacitive element may be set based on at least one of a driving frequency range of the RF power source 200, a resonance frequency necessary for the antenna structure 1000, the number of the antenna segments, and an inductance of the antenna segment. Specifically, when the antenna structure 1000 has a resonance frequency f_r and the total inductance of antenna inductances in the antenna structure 1000 is L_tot, a capacitance of the auxiliary capacitive element may be set such that the total capacitance C_tot of the main capacitive elements 1500 and 1600 and the auxiliary capacitive elements, which are connected to the antenna segments, satisfies Equation (1) below.

$$f_r = \frac{1}{2\pi\sqrt{L_{tot} \times C_{tot}}} \quad (1)$$

In this case, when a capacitance due to a series connection between the first main capacitive element 1500 and the second main capacitive element 1600 is equivalent to that of one auxiliary capacitive element, a capacitance C_a of each of the auxiliary capacitive elements may be set as a value obtained by multiplying C_tot satisfying Equation (1) by the number of the antenna segments included in the antenna structure 1000. Alternatively, when the resonance frequency of the antenna structure 1000 is set to f_r and the inductance of each antenna segment is L_a, the capacitance C_a of each of the auxiliary capacitive elements may be set to satisfy Equation (2) below.

$$f_r = \frac{1}{2\pi\sqrt{L_a \times C_a}} \quad (2)$$

Specifically, when each of the antenna segments in the antenna structure 1000 has an inductance of about 1 μH and the resonance frequency of the antenna structure 1000 is specified as a frequency of 5.03 MHz, the capacitance of each of the auxiliary capacitive elements may be set to about 1 nF. Alternatively, when each of the antenna segments in the antenna structure 1000 has an inductance of about 0.7 pH and the capacitance of each of the auxiliary capacitive elements is set to about 3.32 nF, the antenna structure 1000 may be driven by satisfying a resonance condition at a driving frequency of about 3.3 MHz.

When the capacitance of the auxiliary capacitive element is set to satisfy the above-described conditions, each antenna segment of the antenna structure 1000 may have a potential value in a predetermined range so that a potential difference between the antenna segments may be decreased. As a result, an electrostatic electric field caused by a capacitive coupling can be reduced, the power consumption of the antenna structure 1000 can be reduced, and the durability of the plasma system 10 or the safety of plasma can be improved. A potential, which is applied to each antenna segment due to the auxiliary capacitive elements being disposed between the antenna segments in the antenna structure 1000, will be described below.

The main capacitive elements 1500 and 1600 may have a predetermined electric capacity or capacitance. For example, the capacitance of the main capacitive elements 1500 and 1600 may be set based on at least one of the driving frequency range of the RF power source 200, the resonance frequency necessary for the antenna structure 1000, the number of the antenna segments, the inductance of the antenna segment, and the capacitance of each of the auxiliary capacitive elements. Specifically, when the capacitance of the first main capacitive element 1500 is C1, when the capacitance of the second main capacitive element 1600 is C2, and when the capacitance of each of the auxiliary capacitive elements is C_a, C1 and C2 may be set to satisfy a specific condition. More specifically, C1 and C2 may be set to satisfy Equation (3) below.

$$\frac{1}{C_a} = \frac{1}{C1} + \frac{1}{C2} \tag{3}$$

When the main capacitive elements 1500 and 1600 satisfy Equation (3) above, it is possible to lower a maximum voltage applied to the antenna segment in the antenna structure 1000 and improve a resonance effect, thereby increasing the stability and efficiency of the plasma system 10.

In the above, a case in which the antenna structure 1000 is implemented by arranging four antenna segments in each of two turns has been described as a main embodiment, but the technical idea of the present specification is not limited thereto. Even in the antenna structure 1000 implemented with a plurality of turns each including a plurality of antenna segments, the main capacitive elements 1500 and 1600 and the auxiliary capacitive elements may be disposed similarly to the above-described method.

Figure 9:
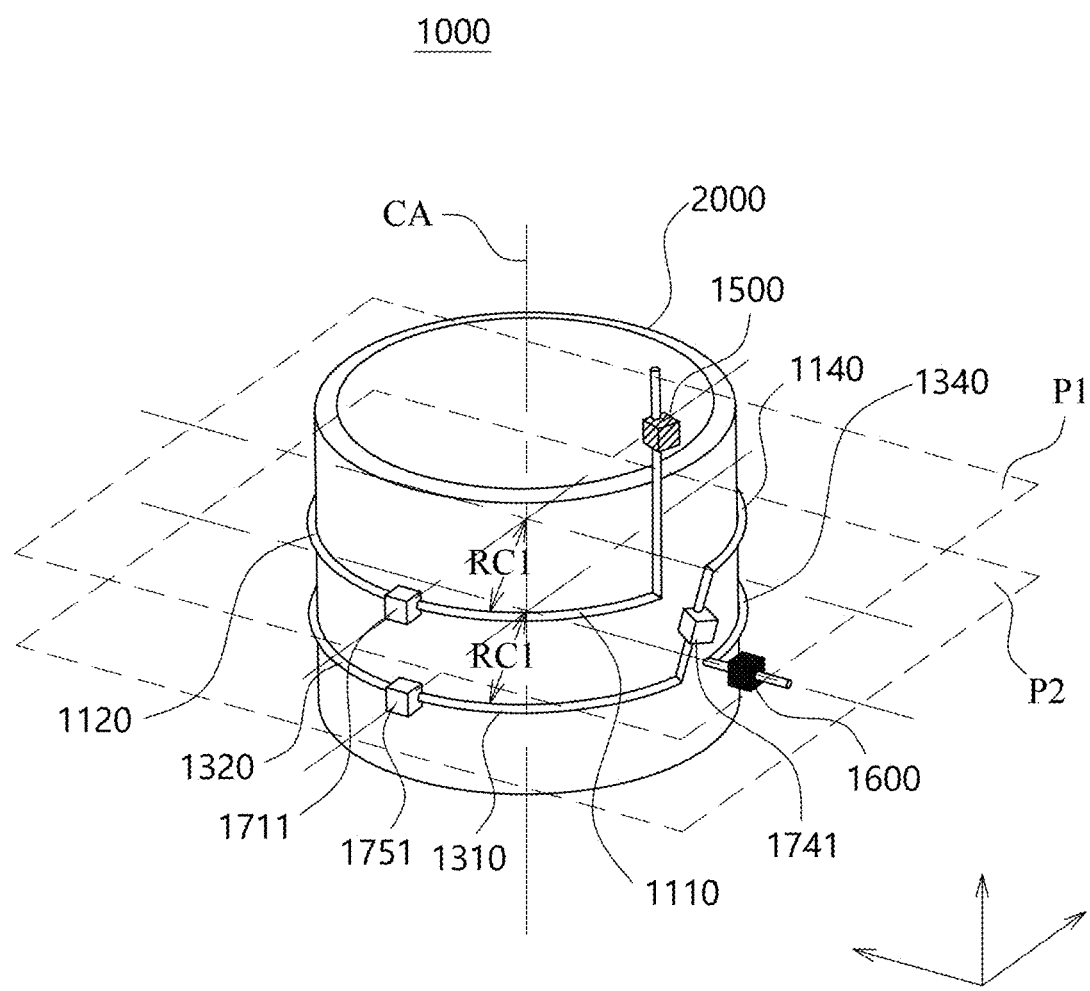
Figure 10:
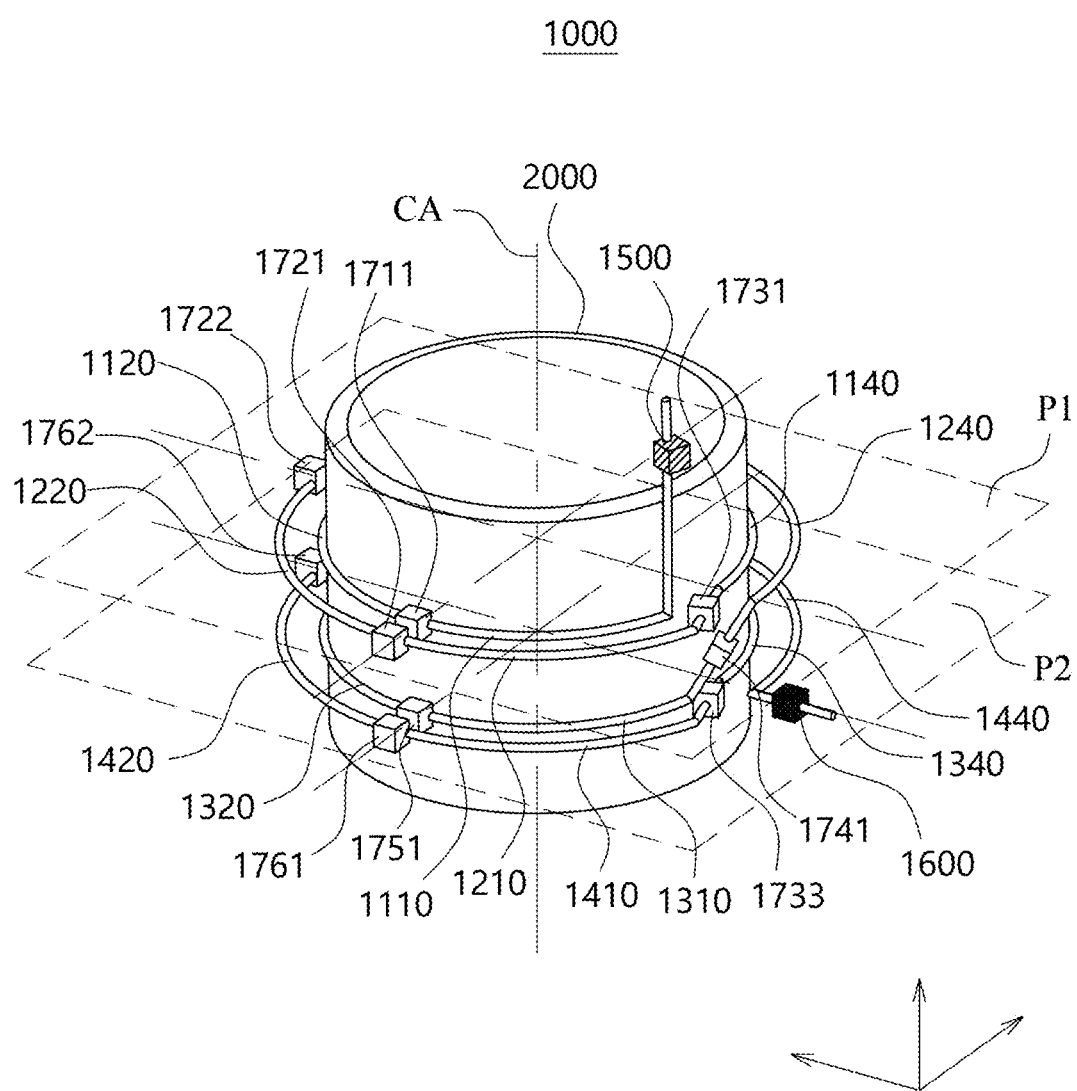

Referring to FIGS. 9 and 10, the antenna structure 1000 may be implemented as a tube type and may include antenna segments, a first main capacitive element 1500, a second main capacitive element 1600, and auxiliary capacitive elements.

Hereinafter, unless otherwise specially stated, the contents described with reference to FIGS. 5 to 8 may be equally applied, and redundant contents will be omitted. For example, a tube type of an antenna structure may be understood as a plurality of antenna structures being disposed on different planes and being physically or electrically connected to each other.

The antenna segments included in the antenna structure 1000 implemented as a tube type may be disposed on a plurality of layers.

Referring again to FIG. 9, the antenna segments may be disposed in two layers on a first plane P1 and a second plane P2 with respect to a central axis CA. Specifically, a first layer may include first to fourth antenna segments 1110, 1120, 1130, and 1140, and a second layer may include ninth to twelfth antenna segments 1310, 1320, 1330, and 1340. Here, the antenna segment of the first layer may have a first radius of curvature RC1, and the antenna segment of the second layer may have a radius of curvature corresponding to the first radius of curvature RC1.

Here, the second plane P2 may refer to a virtual plane that is perpendicular to the central axis CA or meets the central axis CA at one point. Alternatively, the second plane P2 may refer to a plane parallel to the first plane P1.

Each of the antenna segments of the second layer may be disposed to correspond to each of the antenna segments of the first layer. For example, when the first to fourth antenna segments 1110, 1120, 1130, and 1140 are respectively disposed in first to fourth quadrants of the first plane P1, the ninth to twelfth antenna segments 1310, 1320, 1330, and 340 may be disposed in first to fourth quadrants of the second plane P2, respectively.

The antenna segment of the second layer may extend by a length corresponding to a length of the antenna segment of the first layer. For example, when the first antenna segment 1110 is disposed to extend by a first length, the ninth antenna segment 1310 may extend by the first length. Here, similarly, a central angle formed by the central axis CA and the first antenna segment 1110 extending by the first length may correspond to a central angle formed by the central axis CA and the ninth antenna segment 1310 extending by the first length on the second plane P2.

A distance between the first layer and the second layer may be set based on a parasitic capacitance that may occur between the antenna segments. For example, the distance between the first layer and the second layer may be set as a distance at which the influence of a parasitic capacitance is minimized between the first antenna segment 1110 and the ninth antenna segment 1310 when power is applied to the antenna structure 1000. Specifically, the distance between the first layer and the second layer may be set within a range of 0.5 mm to 1.5 mm. In this case, the distance between the first layer and the second layer may be set as a distance for preventing an arc discharge between layers from occurring when the plasma system 10 is driven at a specific driving frequency.

An inductance of the antenna segment of the second layer may be set based on an inductance of the antenna segment of the first layer. For example, an inductance of the ninth antenna segment 1310 may correspond to an inductance of the first antenna segment 1110. For another example, the inductance of the ninth antenna segment 1310 may be set to be greater than the inductance of the first antenna segment 1110.

The antenna structure 1000 implemented as the tube type may be disposed around a plasma generating unit 2000. For example, referring again to FIG. 9, the antenna segments may be disposed around the plasma generating unit 2000. Specifically, the first to fourth antenna segments 1110, 1120, 1130, and 1140 and the ninth to twelfth antenna segments 1310, 1320, 1330, and 1340 may be disposed in contact with the plasma generating unit 2000.

The antenna structure 1000 implemented as the tube type may include the auxiliary capacitive elements. For example, referring again to FIG. 9, first to third auxiliary capacitive elements 1711, 1712, and 1713 may be disposed between the first to fourth antenna segments 1110, 1120, 1130, and 1140 in the first layer of the antenna structure 1000. The first auxiliary capacitive element 1711 may be disposed between the first antenna segment 1110 and the second antenna segment 1120. The second auxiliary capacitive element 1712 may be disposed between the second antenna segment 1120 and the third antenna segment 1130. The third auxiliary capacitive element 1713 may be disposed between the third antenna segment 1130 and the fourth antenna segment 1140. Seventh to ninth auxiliary capacitive elements 1751, 1752, and 1753 may be disposed between the ninth to twelfth antenna segments 1310, 1320, 1330, and 1340 in the second layer of the antenna structure 1000. The seventh auxiliary capacitive element 1751 may be disposed between the ninth antenna segment 1310 and the tenth antenna segment 1320. The eighth auxiliary capacitive element 1752 may be disposed between the tenth antenna segment 1320 and the eleventh antenna segment 1330. The ninth auxiliary capacitive element 1753 may be disposed between the eleventh antenna segment 1330 and the twelfth antenna segment 1340.

Here, the seventh auxiliary capacitive element 1751 may be disposed adjacent to the eighth auxiliary capacitive element 1752 in an arc direction and may be disposed adjacent to the first auxiliary capacitive element 1711 in a direction parallel to the central axis CA. The eighth auxiliary capacitive element 1752 may be disposed adjacent to the seventh auxiliary capacitive element 1751 and the ninth auxiliary capacitive element 1753 in an arc direction and may be disposed adjacent to the second auxiliary capacitive element 1712 in a direction parallel to the central axis CA. The ninth auxiliary capacitive element 1753 may be disposed adjacent to the eighth auxiliary capacitive element 1752 in an arc direction and may be disposed adjacent to the third auxiliary capacitive element 1713 in a direction parallel to the central axis CA.

The auxiliary capacitive elements may be disposed to have a preset positional relationship with each other between the layers. For example, referring again to FIG. 9, at least two of the first to third auxiliary capacitive elements 1711, 1712, and 1713 and the seventh to ninth auxiliary capacitive elements 1751, 1752, and 1753 may be disposed on a virtual line parallel to the central axis CA. Specifically, a virtual extension line connecting the first auxiliary capacitive element 1711 and the seventh auxiliary capacitive element 1751 may be parallel to the central axis CA. For another example, the auxiliary capacitive element of the first layer and the auxiliary capacitive element of the second layer may be disposed at positions corresponding to each other. Specifically, a virtual extension line connecting one of the first to third auxiliary capacitive elements 1711, 1712, and 1713 and one of the seventh to ninth auxiliary capacitive elements 1751, 1752, and 1753 and a virtual extension line connecting the other of the first to third auxiliary capacitive elements 1711, 1712, and 1713 and the other of the seventh to ninth auxiliary capacitive elements 1751, 1752, and 1753 may meet at the central axis CA or within a preset area from the central axis CA or may be at skew positions.

The auxiliary capacitive element may be disposed to be attached to or spaced apart from the plasma generating unit 2000. For example, referring again to FIG. 8, the first auxiliary capacitive element 1711 may be disposed to be spaced apart from the central axis CA by the first radius of curvature RC1 and be in contact with the plasma generating unit 2000. For another example, the first auxiliary capacitive element 1711 may be spaced apart from the central axis CA by a distance greater than the first radius of curvature RC1 and may not be in contact with the plasma generating unit 2000.

The auxiliary capacitive elements disposed in the antenna structure 1000 implemented as the tube type may include interlayer capacitive elements. For example, referring again to FIG. 9, the first layer and the second layer may be electrically connected in series through a first interlayer capacitive element 1741. Specifically, the first interlayer capacitive element 1741 may serially connect the fourth antenna segment 1140 constituting the first layer and the ninth antenna segment 1310 constituting the second layer. Alternatively, unlike that shown in FIG. 9, the first interlayer capacitive element 1741 may serially connect the first antenna segment 1110 constituting the first layer and the twelfth antenna segment 1340 constituting the second layer.

Here, the interlayer capacitive element may have a different shape from other auxiliary capacitive elements or include a separate connecting member so as to connect the layers. For example, one end and the other end of the first interlayer capacitive element 1741 may be positioned on different planes. Specifically, one end of the first interlayer capacitive element 1741 connected to the fourth antenna segment 1140 of the first layer may be positioned on the first plane P1, and the other end of the first interlayer capacitive element 1741 connected to the ninth antenna segment 1310 of the second layer may be positioned on the second plane P2. For another example, the first interlayer capacitive element 1741 may include a third connecting member extending from one end of the first interlayer capacitive element 1741 to the fourth antenna segment 1140 and a fourth connecting member extending from the other end of the first interlayer capacitive element 1741 to the ninth antenna segment 1310. In this case, the third connecting member and the fourth connecting member may include straight or curved conducting wires and may be attached to or spaced apart from the plasma generating unit 2000 by a predetermined distance. In this case, the antenna segment connected to the first interlayer capacitive element 1741 may be shorter or longer than other antenna segments.

Since the antenna structure 1000 includes the interlayer capacitive elements, all the antenna segments in the antenna structure 1000 may be electrically connected.

The antenna structure 1000 implemented as the tube type may be physically or electrically connected to an RF power source 200 through the main capacitive elements 1500 and 1600. For example, referring again to FIG. 9, the first antenna segment 1110 may be electrically connected to a first terminal of an inverter 230 through the first main capacitive element 1500, and the twelfth antenna segment 1340 may be electrically connected to a second terminal of the inverter 230 through the second main capacitive element 1600. Alternatively, the fourth antenna segment 1140 may be electrically connected to the first terminal of the inverter 230 through the first main capacitive element 1500, and the ninth antenna segment 1310 may be electrically connected to the second terminal of the inverter 230 through the second main capacitive element 1600.

A direction in which a current flows in the antenna structure 1000 may be determined according to a method of connecting the main capacitive elements 1500 and 1600, the auxiliary capacitive elements, and the antenna segments. For example, referring again to FIG. 9, when the first main capacitive element 1500 is connected in series to the first antenna segment 1110, the fourth antenna segment 1140 and the ninth antenna segment 1310 are connected in series through the first interlayer capacitive element 1741, and the second main capacitive element 1600 is connected in series to the twelfth antenna segment 1340, and when power is applied to the antenna structure 1000, a current may flow in the first layer and the second layer in the same direction (clockwise or counterclockwise). In this case, when a current flows in the first layer and the second layer in the same direction, an intensity of an induced electric field for plasma generation may be increased as compared with a case in which a current flows in the first layer and the second layer in different directions, and a potential difference between the antenna segments may be reduced, thereby reducing the influence of a parasitic capacitor.

The antenna structure 1000 implemented as the tube type may include antenna segments disposed in a plurality of turns and a plurality of layers.

Referring to FIG. 10, the antenna structure 1000 implemented as a tube type may include first to fourth antenna segments 1110, 1120, 1130, and 1140 disposed in a first turn of a first layer, fifth to eighth antenna segments 1210, 1220, 1230, and 1240 disposed in a second turn of the first layer, ninth to twelfth antenna segments 1310, 1320, 1330, and 1340 disposed in a first turn of a second layer, thirteenth to sixteenth antenna segments 1410, 1420, 1430, and 1440 disposed in a second turn of the second layer, main capacitive elements 1500 and 1600, and auxiliary capacitive elements.

Figure 8:
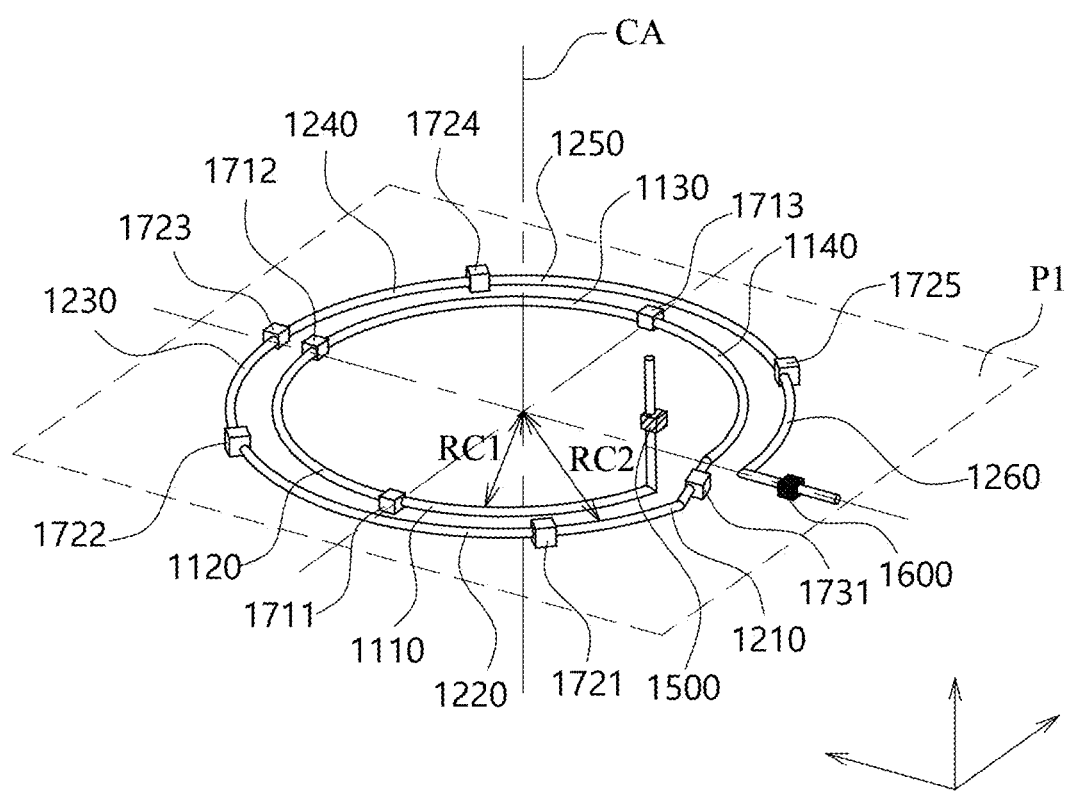

In the antenna structure 1000 implemented as the tube type shown in FIG. 10, the antenna segments may be disposed in the plurality of turns and the plurality of layers identically or similarly to those described with reference to FIGS. 7 to 9.

The auxiliary capacitive elements disposed in the above-described antenna structure 1000 implemented with a multi-turn and a multi-layer may include turn-to-turn capacitive elements and interlayer capacitive elements. For example, referring again to FIG. 10, the antenna structure 1000 implemented with the multi-turn and the multi-layer may include a first turn-to-turn capacitive element 1731 connecting the turns in the first layer, a second turn-to-turn capacitive element 1733 connecting the turns in the second layer, and a first interlayer capacitive element 1741 connecting the first layer and the second layer.

Meanwhile, in the antenna structure 1000, when antenna segments are disposed in three or more layers, the antenna structure 1000 may include a plurality of interlayer capacitive elements or a plurality of interlayer connecting members.

Here, the plurality of interlayer capacitive elements or the plurality of interlayer connecting members may be disposed to have a predetermined positional relationship with each other. For example, the interlayer capacitive elements may be disposed to be rotated by a predetermined angle with respect to a central axis CA. Specifically, the first interlayer capacitive element 1741 connecting the first layer and the second layer may have a predetermined angle together with a second interlayer capacitive element (not shown) connecting the second layer and a third layer with respect to the central axis CA.

In addition, here, the plurality of interlayer capacitive elements or the plurality of interlayer connecting members may connect the antenna segments such that a turn-to-turn connection area in which the turns are connected to each other in layers has a predetermined angle with respect to the central axis CA. For example, when the fourth antenna segment 1140 of the first turn and the fifth antenna segment 1210 of the second turn are connected through the auxiliary capacitive element in the first layer, the first interlayer capacitive element 1741 may connect the eighth antenna segment 1240 and the tenth antenna segment 1320, and the second turn-to-turn capacitive element 1733 may connect the ninth antenna segment 1310 and the fourteenth antenna segment 1420. In this case, since a turn-to-turn connection area is an area in which two different turns are connected in the layers, the plasma generating unit 2000 is not in contact with the antenna segments in the turn-to-turn connection area, and thus, it may be difficult to obtain a cooling effect by a coolant flowing in the antenna segment. However, as described above, since the turn-to-turn connection area, in which the turns are connected to each other in the plurality of layers, forms a predetermined angle, areas, in which the plasma generating unit 2000 is not cooled, can be differently distributed in the layers.

In the antenna structure 1000 implemented with the multi-turn and the multi-layer, a direction in which a current flows in each turn of each layer may be determined according to a method of connecting the main capacitive elements 1500 and 1600, the auxiliary capacitive elements, and the antenna segments. For example, referring again to FIG. 10, when the first main capacitive element 1500 is connected in series to the first antenna segment 1110, the fourth antenna segment 1140 and the fifth antenna segment 1210 are connected in series through the first turn-to-turn capacitive element 1731, the eighth antenna segment 1240 and the ninth antenna segment 1310 are connected in series through the first interlayer capacitive element 1741, the twelfth antenna segment 1340 and the thirteenth antenna segment 1410 are connected in series through the second turn-to-turn capacitive element 1733, and the second main capacitive element 1600 is connected in series to the sixteenth antenna segment 1440, and when power is applied to the antenna structure 1000, a current may flow in the first turn of the first layer, the second turn of the first layer, the first turn of the second layer, and the second turn of the second layer in the same direction (clockwise or counterclockwise). For another example, when the first main capacitive element 1500 is connected in series to the first antenna segment 1110, the fourth antenna segment 1140 and the fifth antenna segment 1210 are connected in series through the first turn-to-turn capacitive elements 1731, the eighth antenna segments 1240 and the thirteenth antenna segment 1410 are connected in series through the first interlayer capacitive element 1741, the sixteenth antenna segments 1440 and the ninth antenna segments 1310 are connected in series through the second turn-to-turn capacitive element 1733, and the second main capacitive element 1600 is connected in series to the twelfth antenna segment 1340, and when power is applied to the antenna structure 1000, a current may flow in the first turn of the first layer, the second turn of the first layer, the first turn of the second layer, and the second turn of the second layer in the same direction (clockwise or counterclockwise).

As described above, when a current flows in the turns of the layers in the same direction, an intensity of an induced electric field for plasma generation may be increased as compared with a case in which a current flows in different directions, and a potential difference between the antenna segments may be reduced, thereby reducing the influence of a parasitic capacitor.

In the above, a case, in which the antenna structure 1000 implemented with the multi-turn and the multi-layer includes four antenna segments per turn, includes two turns per layer and is implemented with a total of two layers has been described as a main embodiment, but the technical idea of the present specification is not limited thereto. The antenna structure 1000 may include p antenna segments per turn, may include q turns per layer, and may be implemented with a total of r layers (wherein p, q, and r are natural numbers), and of course, the above-described contents may be equally/similarly applied thereto.

Hereinafter, a case in which power is applied to the antenna structure 1000 will be described with reference to FIGS. 11 to 13.

Meanwhile, hereinafter, unless otherwise specially stated, for convenience of description, it is assumed that the antenna structure 1000 includes a plurality of auxiliary capacitive elements and a plurality of antenna segments which extend from one end to the other end thereof in one direction along an arc as shown in FIG. 10, but the technical idea of the present specification is not limited thereto.

Figure 11:
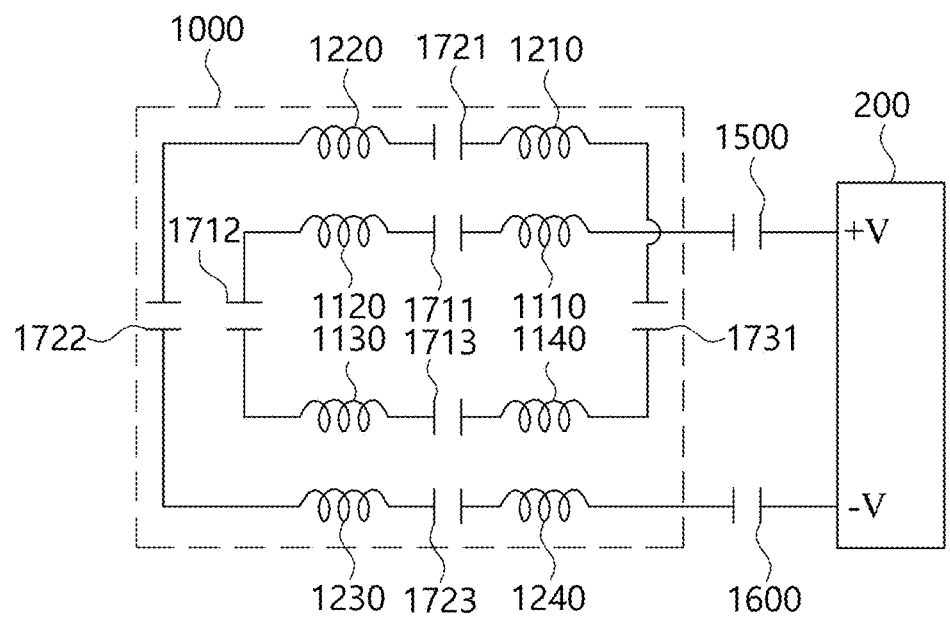
FIG. 11 is a diagram of an equivalent circuit of an antenna structure according to one embodiment of the present specification.

FIG. 11 is a diagram of an equivalent circuit of an antenna structure 1000 according to one embodiment of the present specification.

Referring to FIG. 11, the equivalent circuit of the antenna structure 1000 may include a circuit in which capacitors and inductors are disposed to be alternately connected in series.

A voltage or potential difference of one node in the equivalent circuit of the antenna structure 1000 may be set based on AC power or an AC signal applied to the antenna structure 1000 from an RF power source 200. For example, when the RF power source 200 applies an AC voltage having an amplitude V to the antenna structure 1000, a potential difference of one node in the antenna structure 1000 may oscillate at an amplitude that is less than or equal to the amplitude V.

Hereinafter, when AC power is applied to the antenna structure 1000, a voltage for each position in the antenna structure 1000 according to the presence or absence of a capacitive element will be described.

Here, the voltage for each position may refer to a voltage with respect to a reference node at a position of an antenna segment in the antenna structure 1000. For example, the voltage for each position may refer to a voltage with respect to the reference node at one end of each antenna segment, the other end thereof, or a specific node between the one end and the other after AC power is applied to the antenna structure 1000.

Here, the reference node may refer to a reference point for calculating the voltage for each position. For example, the reference node may include a ground node, a first terminal, a second terminal, one end, or the other end of the RF power source 200, and a point in the antenna structure 1000. Hereinafter, for convenience of description, descriptions will be given assuming that the reference node is one end of the RF power source 200, but the technical idea of the present specification is not limited thereto. The descriptions may be equally/similarly applied even when the reference node is set differently.

Figure 12:
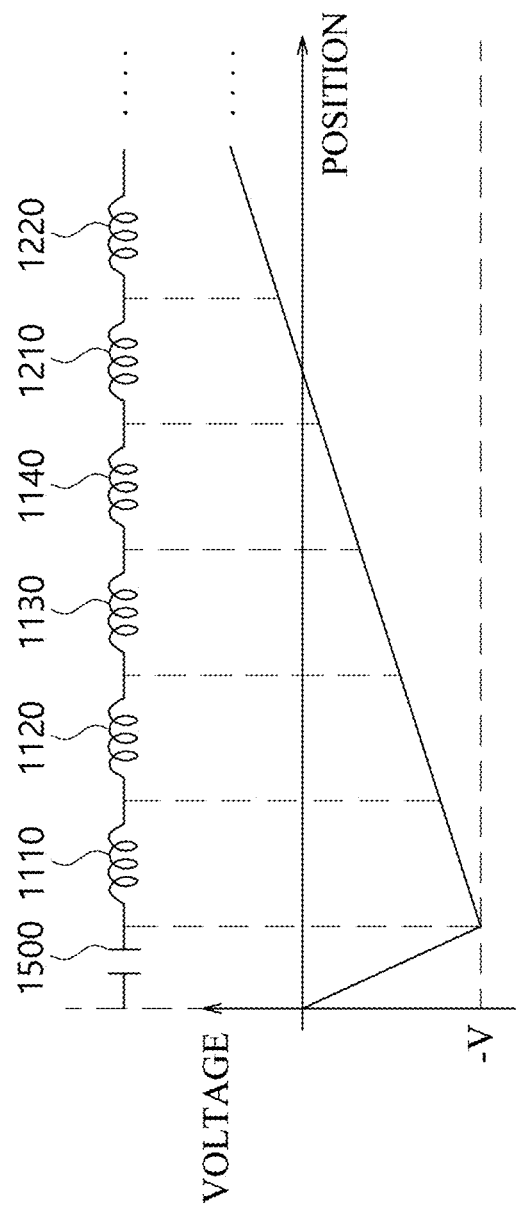
FIG. 12 is a diagram of a graph showing a voltage according to a position in an antenna structure according to one embodiment of the present specification.

FIG. 12 is a diagram of a graph showing a potential according to a position in an antenna structure 1000 according to one embodiment of the present specification.

Referring to FIG. 12, when antenna segments in the antenna structure 1000 are connected in series without capacitive elements, the antenna segments may have voltages in different ranges at any time point. For example, when the antenna segments are connected in series in a state of being disposed as shown in FIG. 6, as AC power is applied, voltages having different magnitudes may be applied to the first antenna segment 1110 and the fifth antenna segment 1210 adjacent to each other. In this case, the influence of a parasitic capacitor between the first antenna segment 1110 and the fifth antenna segment 1210 may be increased, which may be undesirable for plasma induction.

Referring again to FIG. 12, when the antenna segments in the antenna structure 1000 are connected in series without capacitive elements, voltage distribution by the capacitive elements is impossible, thereby increasing a magnitude of a voltage applied to each antenna segment. As described above, when a voltage applied to each antenna segment is increased, unnecessary power consumption may occur, and thus, a plasma system 10 may become unstable.

Figure 13:
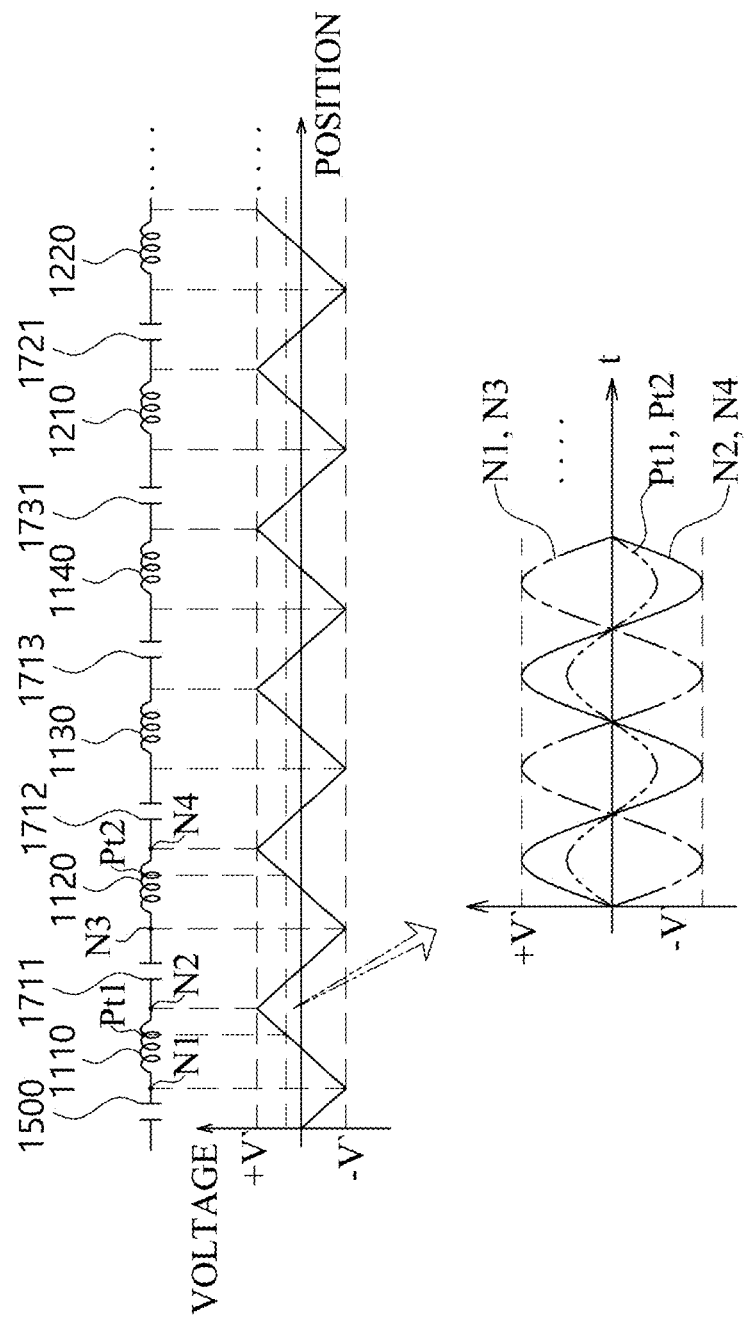
FIG. 13 shows diagrams of graphs showing a voltage according to a position in an antenna structure including capacitive elements according to one embodiment of the present specification.

FIG. 13 shows diagrams of graphs showing a voltage according to a position in an antenna structure 1000 including capacitive elements according to one embodiment of the present specification.

Referring to FIG. 13, the antenna structure 1000 may include a first node N1 to which a first main capacitive element 1500 and a first antenna segment 1110 are connected, a second node N2 to which the first antenna segment 1110 and a first auxiliary capacitive element 1711 are connected, a third node N3 to which the first auxiliary capacitive element 1711 and a second antenna segment 1120 are connected, a fourth node N4 to which the second antenna segment 1120 and a second auxiliary capacitive element 1712 are connected, a first point Pt1 indicating any position in the first antenna segment 1110, and a second point Pt2 indicating any position in the second antenna segment 1120.

Here, FIG. 13 is a graph showing maximum voltages applied to the antenna segments when AC power is applied to the antenna structure 1000, and illustrated signs may refer to a phase difference. In addition, a voltage of FIG. 13 may refer to a voltage at a time point at which a maximum voltage is obtained for each position in the antenna structure 1000. Meanwhile, in an AC waveform, a maximum voltage may be divided into a maximum voltage having a positive value and a maximum voltage having a negative value, and the graph of FIG. 13 may be construed as showing a voltage for each position in the antenna structure 1000 based on a time point at which the first node N1 has a maximum voltage having a negative value. For example, the first node N1 and the second node N2 having maximum voltages of −V' and +V' have a maximum voltage as high as an absolute value of V', which may mean that AC voltages having opposite signs have been applied. That is, this may mean that AC voltages having an amplitude of V' and a phase difference of one half cycle are applied to the first node N1 and the second node N2. In other words, at a time point at which a voltage value of −V' is measured through the first node N1, a voltage value of +V' may be measured through the second node N2.

Referring again to FIG. 13, voltages of nodes corresponding to each other in the antenna structure 1000 may correspond to each other. For example, voltages of the first node N1 and the third node N3 may correspond to each other. Alternatively, maximum voltages of the first node N1 and the third node N3 may correspond to each other. Voltages of the second node N2 and the fourth node N4 may correspond to each other. Alternatively, maximum voltages of the second node N2 and the fourth node N4 may correspond to each other. A voltage of one end of the first antenna segment 1110 and a voltage of one end of the second antenna segment 1120 may correspond to each other. A voltage of one end of the first auxiliary capacitive element 1711 and a voltage of one end of the second auxiliary capacitive element 1712 may correspond to each other. The voltage of one end of the first antenna segment 1110 may correspond to a voltage of one end of a fifth antenna segment 1210 or a ninth antenna segment 1310 adjacent to the first antenna segment 1110.

Meanwhile, effective values of voltages of nodes corresponding to each other may correspond to each other. For example, effective values of the voltages of the first node N1 and the third node N3 may correspond to each other, and effective values of the voltages of the second node N2 and the fourth node N4 may correspond to each other.

Here, voltages of a plurality of nodes corresponding to each other or the plurality of nodes having voltages corresponding to each other may mean a case in which the plurality of nodes have the same voltage or maximum voltage with respect to a reference node, or a difference between the voltages or the maximum voltages of the plurality of nodes with respect to the reference node is within a preset range.

The plurality of antenna segments may include points corresponding to each other. For example, the first point Pt1 positioned between one end and the other end of the first antenna segment 1110 may correspond to the second point Pt2 positioned between one end and the other end of the second antenna segment 1120. Specifically, a distance between the first point Pt1 in the first antenna segment 1110 and one end of the first antenna segment 1110 may correspond to a distance between the second point Pt2 and one end of the second antenna segment 1120. For another example, the first point Pt1 in the first antenna segment 1110 may correspond to a third point (not shown) in the fifth antenna segment 1210. In this case, an angle formed by one end of the first antenna segment 1110, a central axis CA, and the first point Pt1 may correspond to an angle formed by one end of the fifth antenna segment 1210, the central axis CA, and the third point. Specifically, an extension line connecting the first point Pt1 and the third point may meet the central axis CA or may be at a skew position. For still another example, the first point Pt1 in the first antenna segment 1110 may correspond to a fourth point (not shown) in the ninth antenna segment 1310. Specifically, an extension line connecting the first point Pt1 and the fourth point may be parallel to the central axis CA or may be at a skew position.

The above-described points corresponding to each other in the plurality of antenna segments may have voltages corresponding to each other. Alternatively, the points corresponding to each other in the plurality of antenna segments may have effective voltages corresponding to each other. As described above, when antenna segments are adjacent to each other, the antenna segments have voltages corresponding to each other at positions corresponding to each other so that it is possible to reduce the influence of a parasitic capacitance.

Here, voltages of a plurality of points corresponding to each other or the plurality of points having voltages corresponding to each other may mean a case in which the plurality of points have the same voltage or maximum voltage with respect to a reference node, or a difference between the voltages or the maximum voltages of the plurality of points with respect to the reference node is within a preset range. In addition, here, angles, which are formed by the plurality of points, one end of each antenna segment, and the central axis CA corresponding to each other may mean a case in which the plurality of points are positioned to be rotated by the same angle or different angles from one end of each antenna segment with respect to the central axis CA.

Meanwhile, referring again to FIG. 13, a magnitude of a voltage at any point in an antenna segment may be smaller than a magnitude of a voltage at a node to which the antenna segment and a capacitive element are connected. For example, a maximum voltage of the first point Pt1 and the second point Pt2 may be smaller than that of the second node N2 or the fourth node N4.

Voltage at any nodes or positions in the antenna structure 1000 may have different phases or different signs at any time point. For example, at one time point, voltages of the first node N1 and the third node N3 have the same phase, and the first node N1 and the second node N2 have voltages having the same magnitude and having opposite phases or signs. For another example, the second node N2 and the third node N3 may have voltages having the same magnitude and having opposite phases or signs.

In the above, for convenience of description, voltages at nodes and points have been described based on a specific antenna segment in the antenna structure 1000, but the technical concept of the present specification is not limited thereto. The descriptions may be applied to each antenna segment in the antenna structure 1000 in the same/similar manner.

A voltage for each position in the antenna structure 1000 may be decreased as the number of the auxiliary capacitive elements included in the antenna structure 1000 is increased. Alternatively, the voltage for each position in the antenna structure 1000 may be determined based on an inductance of the antenna segment or a capacitance of the auxiliary capacitive element, which is included in the antenna structure 1000. Specifically, unlike that shown in FIG. 13, when the auxiliary capacitive element is disposed between the antenna segments, magnitude of voltage applied to each of the antenna segments are determined to correspond to each other, thereby reducing the influence of a parasitic capacitor between adjacent antenna segments. In addition, when the auxiliary capacitive element is disposed in the antenna structure 1000, magnitudes of voltages applied to the antenna segments are decreased, thereby reducing power consumption by the antenna structure 1000 and improving the safety of a plasma system 10.

The main capacitive elements 1500 and 1600 may reduce an amplitude of a voltage applied to the antenna structure 1000. Alternatively, the main capacitive elements 1500 and 1600 may lower a maximum amplitude of a voltage that may be applied to each antenna segment.

Alternatively, since the main capacitive elements 1500 and 1600 are connected to the antenna segments, a maximum voltage of a node in the antenna structure 1000 with respect to a reference node may not be zero. For example, as a voltage drops in the main capacitive elements 1500 and 1600 with respect to the reference node, the first to fourth nodes N1, N2, N3, and N4 may have a maximum voltage rather than zero.

Alternatively, due to the main capacitive elements 1500 and 1600, voltages having the same amplitude may be applied to nodes in the antenna structure 1000. For example, due to the main capacitive elements 1500 and 1600, the first node N1 and the second node N2 may have voltages having the same amplitude with respect to the reference node. As another example, due to the main capacitive elements 1500 and 1600, the first node N1 and the second node N2 may receive voltages having the same amplitude and different signs. As described above, the main capacitive elements 1500 and 1600 may reduce a voltage or maximum voltage applied to the components in the antenna structure 1000, and thus, the electrical durability of the antenna structure 1000 may be improved.

Meanwhile, when the plasma system 10 is driven, as inductively coupled plasma is induced to the plasma generating unit 2000 by the antenna structure 1000, a temperature may be increased. Accordingly, the plasma generating unit 2000 may be damaged. To prevent the damage to the plasma generating unit 2000, the antenna structure 1000 may include a coolant channel to absorb heat from the plasma generating unit 2000. In this case, a degree of absorption of heat generated in the plasma generating unit 2000 may vary according to the structure and shape of the antenna structure 1000.

Hereinafter, according to one embodiment of the present specification, the structure and shape of the antenna structure 1000 for efficiently absorbing heat generated in the plasma generating unit 2000 as plasma is induced when the plasma system 10 is driven will be described with reference to FIGS. 14 and 15.

Figure 14:
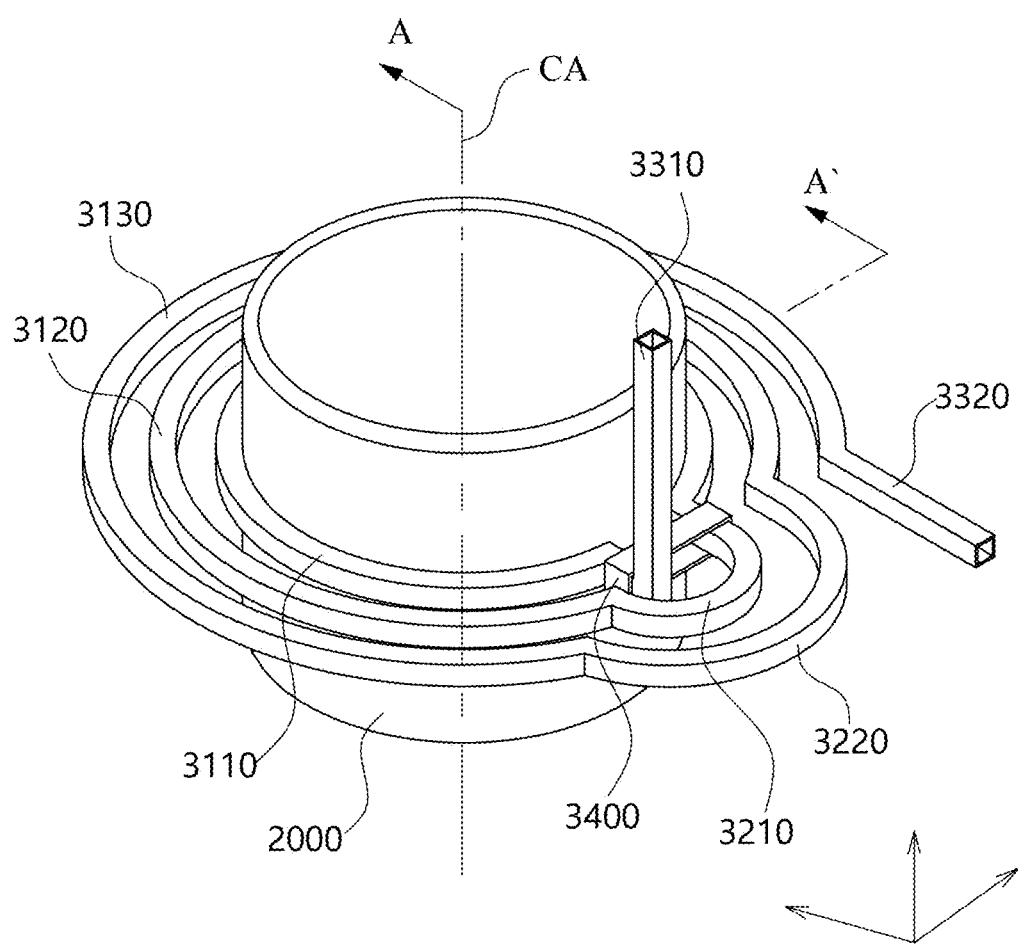
FIG. 14 is a diagram of an antenna structure having a rectangular cross-section according to one embodiment of the present specification.

FIG. 14 is a diagram of an antenna structure 1000 having a rectangular cross-section according to one embodiment of the present specification.

Figure 15:
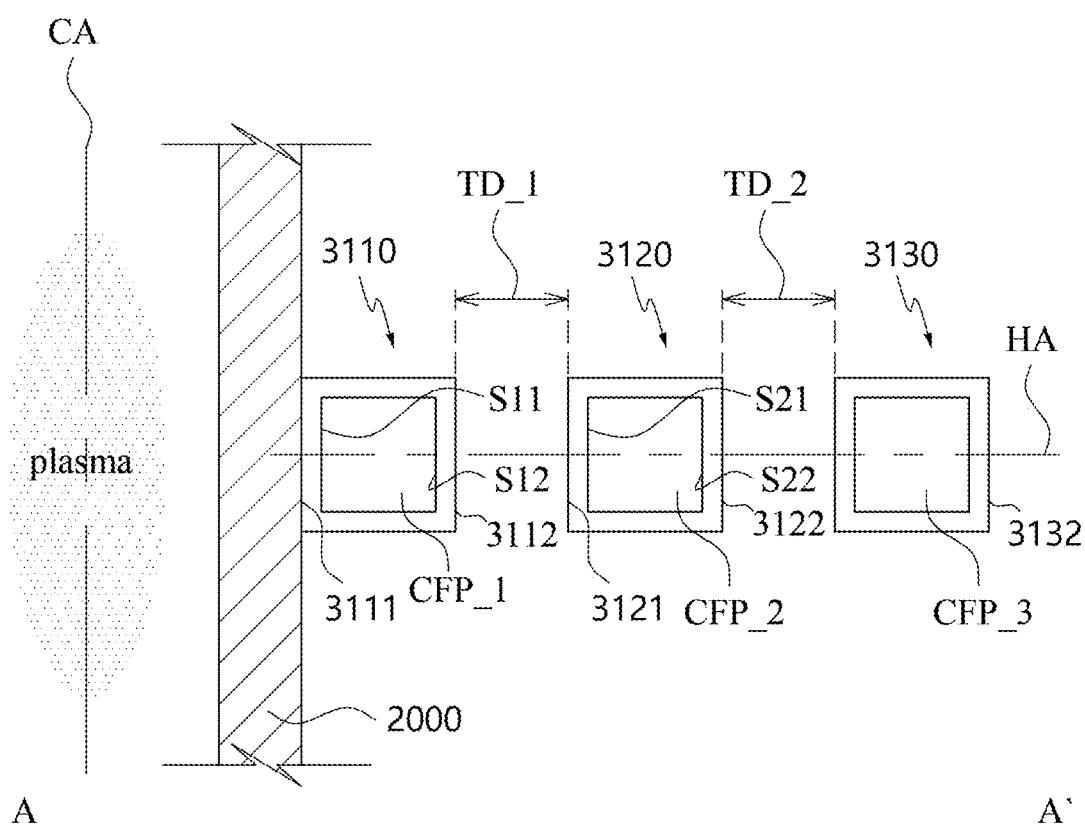
FIG. 15 is a diagram of a cross-section of the antenna structure according to one embodiment of the present specification.

FIG. 15 is a diagram of a cross-section A-A' of the antenna structure 1000 according to one exemplary embodiment of the present specification.

Referring to FIG. 14, the antenna structure 1000 may include turn antennas, ends of antenna, turn-to-turn connecting members, and a fastening member 3400. Specifically, the antenna structure 1000 may include first to third turn antennas 3110, 3120, and 3130, a first end and a second end of antenna 3310 and 3320, first and second turn-to-turn connecting members 3210 and 3220, and the fastening member 3400.

The turn antenna may refer to an antenna constituting one turn in the antenna structure 1000. For example, as shown in FIG. 14, the turn antennas may include the first to third turn antennas 3110, 3120, and 3130. Specifically, the first to third turn antennas 3110, 3120, and 3130 may be implemented in circular shapes or ring shapes having different radii of curvature with respect to a central axis CA. More specifically, the second turn antenna 3120 may be disposed to surround the first turn antenna 3110, and the third turn antenna 3130 may be disposed to surround the second turn antenna 3120. In this case, the first to third turn antennas 3110, 3120, and 3130 may be disposed on a horizontal axis HA perpendicular to the central axis CA. Alternatively, the first to third turn antennas 3110, 3120, and 3130 may be disposed to be spaced apart from the horizontal axis HA by different distances.

The turn antenna may have a cross-section having a rectangular shape. However, the technical idea of the present specification is not limited thereto, and the cross-section of the turn antenna may have a polygonal shape, a circle shape, an ellipse shape, or a figure shape composed of a curved line and a straight line in addition to the rectangular shape.

The turn antenna may be physically or electrically connected to an RF power source 200 through an end of antenna. For example, the first turn antenna 3110 may be physically or electrically connected to the first end of antenna 3310, and the first end of antenna 3310 may be physically or electrically connected to one end of the RF power source 200. In addition, for example, the third turn antenna 3130 may be physically or electrically connected to the second end of antenna 3320, and the second end of antenna 3320 may be physically or electrically connected to the other end of the RF power source 200.

The turn antenna may be electrically or physically connected to another turn antenna through the turn-to-turn connecting member. For example, the first turn antenna 3110 may be electrically or physically connected to one end of the first turn-to-turn connecting member 3210, and the second turn antenna 3120 may be electrically or physically connected to the other end of the first turn-to-turn connecting member 3210. In addition, for example, the second turn antenna 3120 may be electrically or physically connected to one end of the second turn-to-turn connecting member 3220, and the third turn antenna 3130 may be electrically or physically connected to the other end of the second turn-to-turn connecting member 3220.

The ends of antenna may physically or electrically connect the turn antenna and the RF power source 200.

The ends of antenna may include a conductor extending in any direction. For example, referring again to FIG. 14, the first end of antenna 3310 may extend in a direction parallel to the central axis CA, and the second end of antenna 3320 may extend in a direction perpendicular to the central axis CA. However, the technical idea of the present specification is not limited thereto, and of course, the first and second end of antenna 3310 and 3320 may extend in any direction based on a turn-to-turn connecting method or the like.

The turn-to-turn connecting member may be formed in various shapes. For example, the turn-to-turn connecting member may have a curved line or straight line shape. The turn-to-turn connecting member will be described in detail below.

The fastening member 3400 may prevent at least a portion of the antenna structure 1000 from being expanded or deformed. Specifically, a plasma generating unit 2000 may be expanded and deformed due to high-temperature thermal energy generated as plasma is induced. Accordingly, the antenna structure 1000 in close contact with the plasma generating unit 2000 may also be expanded and deformed. The fastening member 3400 may prevent the deformation of the antenna structure 1000. For example, referring again to FIG. 14, the fastening member 3400 having elasticity may be coupled to the first turn antenna 3110 adjacent to the plasma generating unit 2000. The antenna structure 1000 may include the fastening member 3400 and thus be in close contact with the plasma generating unit 2000. Furthermore, even though plasma is induced, the antenna structure 1000 may maintain a close contact state to improve the efficiency of cooling performed by the antenna structure 1000 to be described below.

Here, the fastening member 3400 may provide a tightening force greater than or equal to a preset value to the antenna structure 1000. For example, the fastening member 3400 may include an object having flexibility or elasticity. In addition, for example, the fastening member 3400 may include a metal that is shorter than an object to be tightened.

Meanwhile, the antenna structure 1000 may cool the plasma generating unit 2000 using a coolant. To this end, referring to FIG. 14, the turn antennas in the antenna structure 1000 may have a preset shape and may include coolant channels. Specifically, the first to third turn antennas 3110, 3120, and 3130 may include first to third coolant channels CFP_1, CFP_2, and CFP_3, respectively, and the first turn antenna 3110 may be in contact with the plasma generating unit 2000 to absorb heat generated in the plasma generating unit 2000 using a coolant moved through the first to third coolant channels CFP_1, CFP_2, and CFP_3.

Here, the coolant may include a fluid below a preset temperature.

The turn antenna may include an inner diameter surface and an outer diameter surface. For example, the first to third turn antennas 3110, 3120, and 3130 have first to third inner diameter surfaces 3111, 3121, and 3131 and first to third outer diameter surfaces 3112, 3122, and 3132, respectively. Here, the inner diameter surface and the outer diameter surface may be one of a plurality of surfaces forming the turn antenna. In addition, here, the inner diameter surface and the outer diameter surface may refer to an inner surface and an outer surface of the turn antenna surrounding the central axis CA. In addition, here, the inner diameter surface and the outer diameter surface may refer to facing surfaces disposed in a direction away from the central axis CA in the turn antenna, and the inner diameter surface may be closer to the central axis CA of the antenna structure 1000 than the outer diameter surface. In this case, a cross-sectional shape of the turn antenna may at least be formed based on the inner diameter surface and the outer diameter surface. Meanwhile, the turn antenna may include an upper surface and a lower surface in addition to the inner diameter surface and the outer diameter surface.

The coolant channel may include surfaces corresponding to the inner and outer diameter surfaces of the turn antenna. For example, the first coolant channel CFP_1 may include a first surface S11 corresponding to the first inner diameter surface 3111 and a second surface S12 corresponding to the first outer diameter surface 3112. Here, a cross-sectional shape of the first coolant channel CFP_1 may at least be formed based on the first surface S11 and the second surface S12. For another example, the second coolant channel CFP_2 may include a third surface S21 corresponding to the second inner diameter surface 3121 and a fourth surface S22 corresponding to the second outer diameter surface 3122. Here, a cross-sectional shape of the second cooling water passage CFP_2 may at least be formed based on the third surface S21 and the fourth surface S22. Meanwhile, the coolant channel may include an upper surface and a lower surface in addition to the surfaces corresponding to the inner diameter surface and the outer diameter surface.

In the above, the coolant channel may be construed as being defined by the inner surface of the turn antenna. For example, one surface of the coolant channel may be construed as being substantially the same as the inner surface of the turn antenna. Specifically, the first surface S11 and the second surface S12 of the first coolant channel CFP_1 may be construed as being inner surfaces of the first turn antenna 3110, and the third surface S21 and the fourth surface S22 of the second coolant channel CFP_2 may be construed as being inner surfaces of the second turn antenna 3120.

The antenna structure 1000 may absorb heat from the plasma generating unit 2000 through an inner diameter surface of a turn antenna in contact with the plasma generating unit 2000 and one surface of a coolant channel corresponding thereto.

In order to increase cooling efficiency or to make heat conduction more active, the antenna structure 1000 may be in surface contact with the plasma generating unit 2000. For example, referring again to FIG. 15, the first inner diameter surface 3111 of the first turn antenna 3110 may be formed parallel to an outer wall of the plasma generating unit 2000 or the central axis CA, and the first turn antenna 3110 may be in surface contact with the plasma generating unit 2000 through the first inner diameter surface 3111. In this case, the first surface S11 of the first coolant channel CFP_1 corresponding to the first inner diameter surface 3111 may be parallel to the first inner diameter surface 3111 and the outer wall of the plasma generating unit 2000 or the central axis CA, and the antenna structure 1000 may absorb heat from the plasma generating unit 2000 through the first inner diameter surface 3111 and the first surface S11.

A cross-section of the antenna structure 1000 for increasing the cooling efficiency with respect to the plasma generating unit 2000 may have a rectangular shape. For example, referring again to FIG. 15, cross-sections of the first to third turn antennas 3110, 3120, and 3130 may have a rectangular shape, and accordingly, the first to third inner diameter surfaces 3111, 3121, and 3131 may be parallel to the first to third outer diameter surfaces 3112, 3122, and 3132, respectively. In this case, a cross-section of the coolant channel may also have a rectangular shape.

Here, the first inner diameter surface 3111, the first surface S11, the second surface S12, and the first outer diameter surface 3112 may be parallel to each other. Accordingly, a distance between the first inner diameter surface 3111 and the first surface S11 may be constant within a predetermine range from the horizontal axis HA, and a distance between the second surface S12 and the first outer diameter surface 3112 may also be constant within a predetermined range from the horizontal axis HA.

In addition, here, the second inner diameter surface 3121 of the second turn antenna 3120 and the third surface S21 of the second coolant CFP_2 may be parallel to the first outer diameter surface 3112 of the first turn antenna 3110 and the second surface S12 of the first coolant channel CFP_1. Accordingly, a distance between the second surface S12 and the third surface S21 may be constant within a predetermined range from the horizontal axis HA.

Meanwhile, when the cross-section of the antenna structure 1000 has a rectangular shape, energy loss due to a parasitic capacitor may occur between the turn antennas. For example, as shown in FIG. 15, when the first outer diameter surface 3112 of the first turn antenna 3110 is parallel to the second inner diameter surface 3121 of the second turn antenna 3120, energy loss due to a parasitic capacitor may occur.

The energy loss due to the parasitic capacitor between the turn antennas may be changed according to a turn-to turn distance between the turn antennas. For example, in FIG. 15, the influence of the parasitic capacitor in the antenna structure 1000 may be changed according to a first turn-to-turn distance TD_1 between the first turn antenna 3110 and the second turn antenna 3120 and a second turn-to-turn distance TD_2 between the second turn antenna 3120 and the third turn antenna 3130.

Accordingly, in the antenna structure 1000, the influence of the parasitic capacitor may be reduced by setting the turn-to-turn distance between the turn antennas within a preset range. In this case, the preset range may be set in consideration of the influence of the parasitic capacitor and an overall width of the antenna structure 1000. For example, the turn-to-turn distance may be set within a range of 0.5 mm to 3.5 mm.

The turn-to-turn distances may all have the same value or have different values. For example, the first turn-to-turn distance TD_1 and the second turn-to-turn distance TD_2 may have the same value within a preset range. For another example, the first turn-to-turn distance TD_1 and the second turn-to-turn distance TD_2 may have different lengths. For example, the first turn-to-turn distance TD_1 have a value that is greater than or less than the second turn-to-turn distance TD_2.

In the above, in relation to the antenna structure 1000 for performing a cooling function, the turn antennas having a rectangular cross-section and the structure and shape of the antenna structure 1000 for reducing the influence of the parasitic capacitor according to the turn antennas has been described.

Hereinafter, other embodiments of the structure and shape of the antenna structure 1000, which reduces the influence of the parasitic capacitor while performing the cooling function, will be described with reference to FIGS. 16 to 19.

Figure 16:
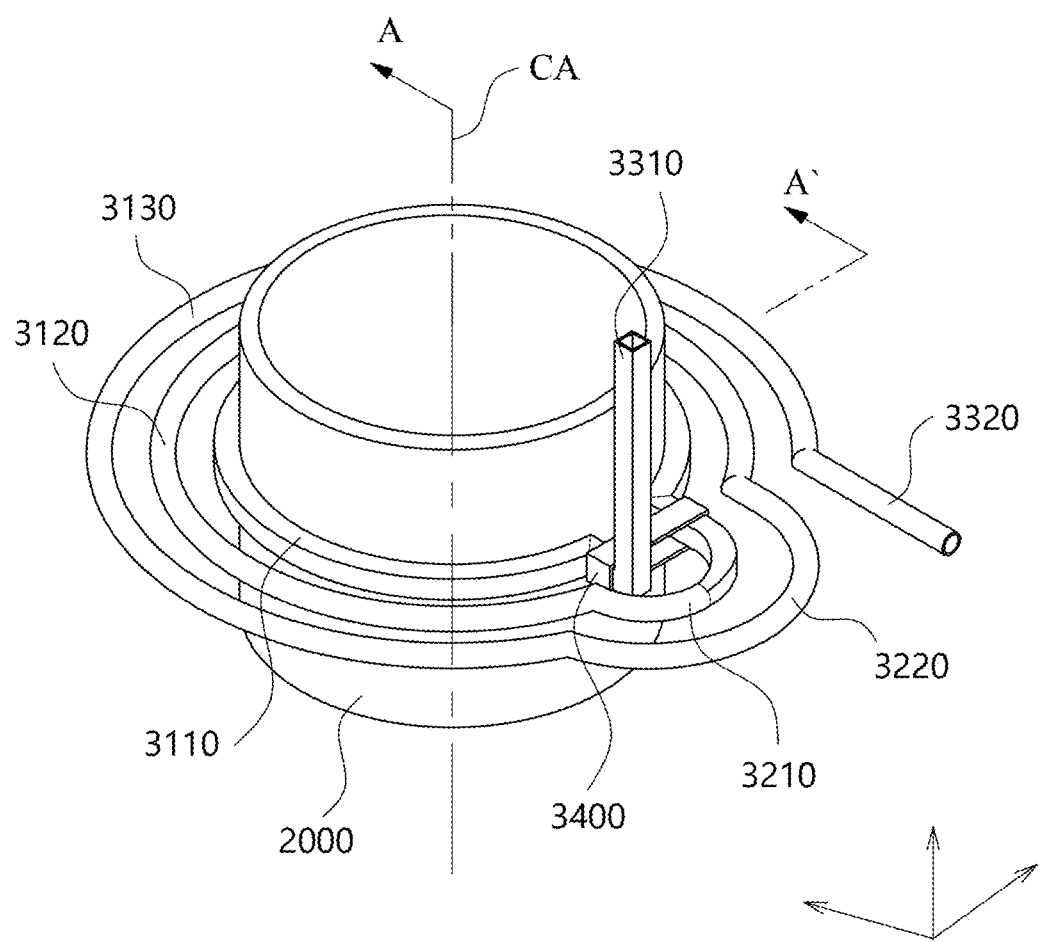
FIG. 16 is a diagram of an antenna structure having a rectangular cross-section and a circular cross-section according to one embodiment of the present specification.

FIG. 16 is a diagram of an antenna structure 1000 having a rectangular cross-section and a circular cross-section according to one embodiment of the present specification.

Figure 17:
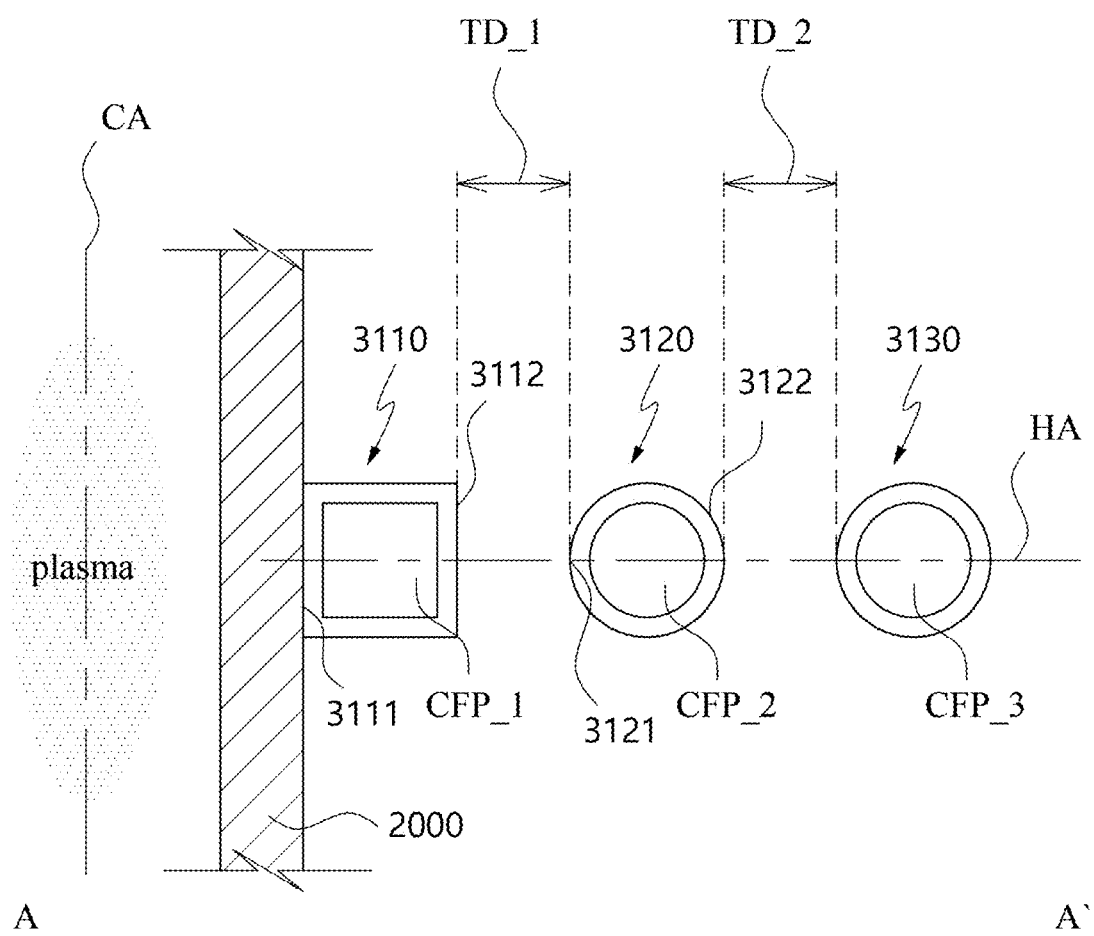
FIGS. 17 and 18 are diagrams of a cross-section of the antenna structure having at least two cross-sectional shapes according to one embodiment of the present specification.
Figure 18:
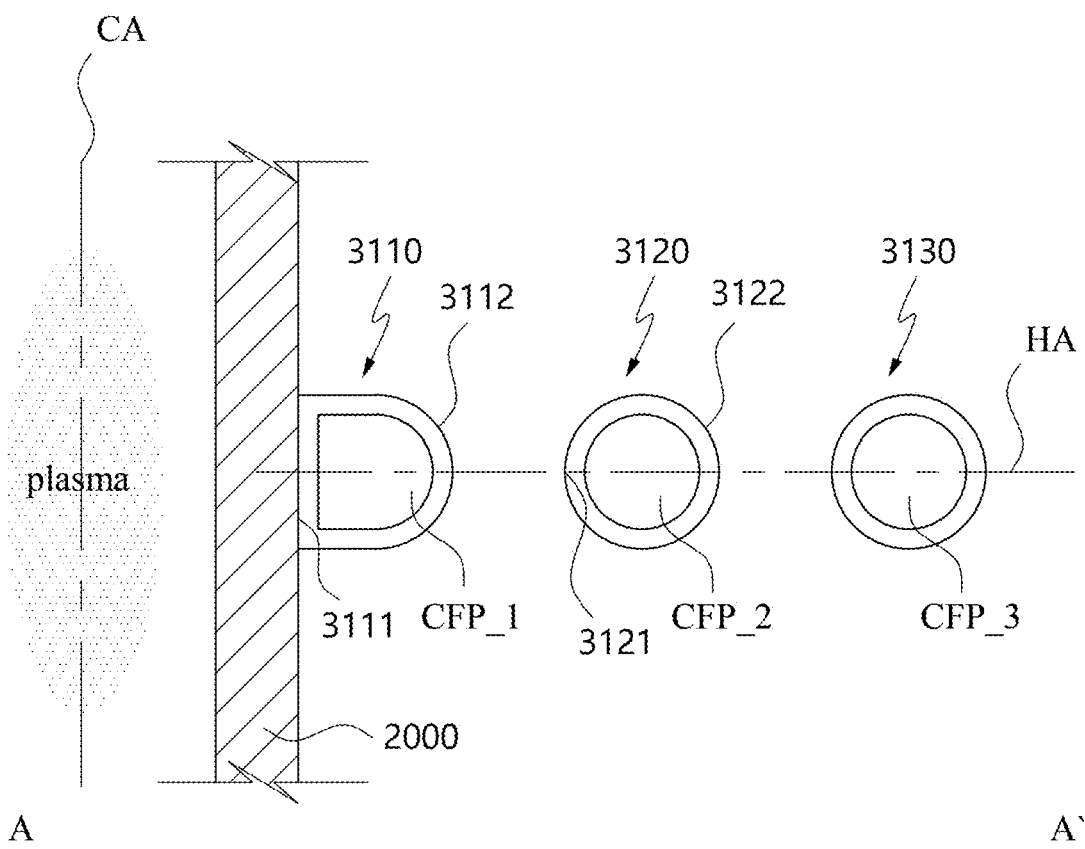
Figure 19:
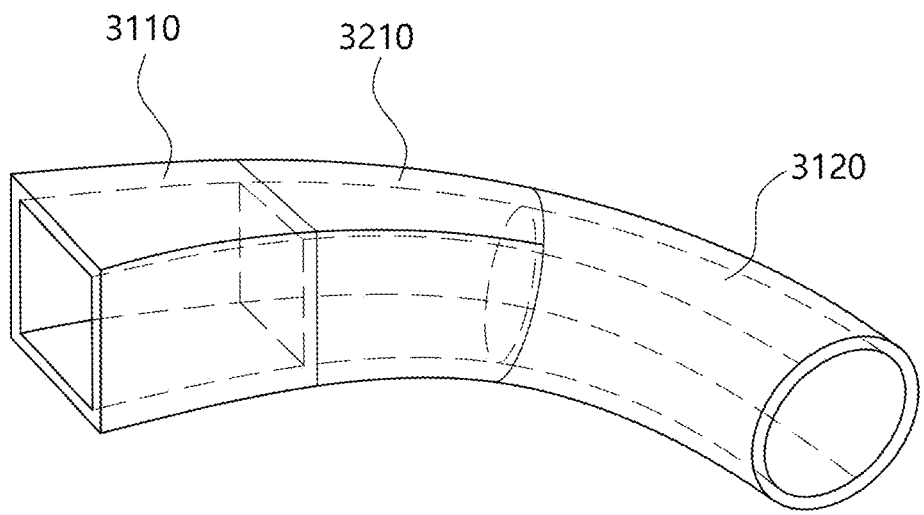
FIGS. 19 to 22 are diagrams of a method of connecting antennas having different cross-sections in an antenna structure according to one exemplary embodiment of the present specification.

FIGS. 17 and 18 are diagrams of a cross-section A-A' of the antenna structure 1000 having at least two cross-sectional shapes according to one embodiment of the present specification.

Referring to FIGS. 16 and 17, the antenna structure 1000 may include turn antennas having different shapes. For example, the antenna structure 1000 may include a first turn antenna 3110 having a rectangular cross-section and second and third turn antennas 3120 and 3130 having a circular cross-section.

Hereinafter, unless otherwise specially stated, the contents of the antenna structure 1000 described with reference to FIG. 14 may be similarly applied.

The antenna structure 1000 may include a turn antenna in surface contact with a plasma generating unit 2000. For example, the antenna structure 1000 may include the first turn antenna 3110 in surface contact with the plasma generating unit 2000 through a first inner diameter surface 3111.

The turn antennas in the antenna structure 1000 may have surfaces that are not parallel to each other in order to reduce the influence of a parasitic capacitor between the turn antennas. For example, referring again to FIG. 17, the first inner diameter surface 3111 and a first outer diameter surface 3112 of the first turn antenna 3110 may be parallel to an outer wall of the plasma generating unit 2000, and a second inner diameter surface 3121 and a second outer diameter surface 3122 of the second turn antenna 3120 may not be parallel to the plasma generating unit 2000 and the first inner diameter surface 3111.

The antenna structure 1000 may include turn antennas having different cross-sections in order to reduce the influence of a parasitic capacitor between the turn antennas. For example, referring again to FIG. 17, the antenna structure 1000 may include the first turn antenna 3110 having the rectangular cross-section and the second turn antenna 3120 having the circular cross-section. In this case, a first coolant channel CFP_1 may have a rectangular cross-section so as to correspond to the first turn antenna 3110, and a second coolant channel CFP_2 may have a circular cross-section so as to correspond to the second turn antenna 3120. However, a cross-section of a turn antenna is not limited to a rectangular shape or a circular shape and may be a polygonal shape, a circular shape, an ellipse shape, or a figure shape composed of a curved line and a straight line.

As described above, when the antenna structure 1000 includes turn antennas having surfaces not parallel to each other or having different cross-sections, the influence of a parasitic capacitor can be reduced.

In turn antennas having different cross-sections, turn-to-turn distances may be the same, but a distance between surfaces of the turn antennas may not be constant. For example, referring again to FIG. 17, the first to third turn antennas 3110, 3120, and 3130 may be disposed such that the first turn-to-turn distance TD_1 and the second turn-to-turn distance TD_2 may be the same with respect to a horizontal axis HA. In addition, for example, referring again to FIG. 17, a distance between the first outer diameter surface 3112 of the first turn antenna 3110 and the first inner diameter surface 3121 of the second turn antenna 3120 may not be constant. Specifically, in FIG. 17, as a distance from the horizontal axis HA is increased in a direction parallel to a central axis CA or in a longitudinal direction of the plasma generating unit 2000, since a distance between the first turn antenna 3110 and the second turn antenna 3120 is increased, the influence of a parasitic capacitor may be reduced as compared with a case in which the distance between the first turn antenna 3110 and the second turn antenna 3120 is constant. Alternatively, when the first turn antenna 3110 and the second turn antenna 3120 are disposed on the same plane, as a distance from the plane is increased in a direction parallel to the central axis CA or in the longitudinal direction of the plasma generating unit 2000, since a distance between the first turn antenna 3110 and the second turn antenna 3120 is increased, the influence of a parasitic capacitor may be reduced as compared with a case in which the distance between the first turn antenna 3110 and the second turn antenna 3120 is constant.

Meanwhile, the antenna structure 1000 may include a turn antenna including an inner diameter surface and an outer diameter surface which have different shapes so as to reduce the influence of a parasitic capacitor between turn antennas.

Referring to FIG. 18, a first turn antenna 3110 in contact with the plasma generating unit 2000 may include a first inner diameter surface 3111 that is parallel to the outer wall of the plasma generating unit 2000 and a first outer diameter surface 3112 that is not parallel to the outer wall of the plasma generating unit 2000. Alternatively, the first turn antenna 3110 may include a first inner diameter surface 3111 that is parallel to the outer wall of the plasma generating unit 2000 and a first outer diameter surface 3112 that is vertically bent in a direction away from a central axis CA. In this case, the first turn antenna 3110 may have a cross-section composed of a straight line and a curved line. Specifically, the first turn antenna 3110 may have a cross-section having a combination of a rectangular shape and a semicircular shape, a semicircular shape, or a semi-ellipse shape.

In the antenna structure 1000 including a turn antenna having an inner diameter surface and an outer diameter surface or a cross-section as described above, while the plasma generating unit 2000 can be efficiently cooled, energy loss due to a parasitic capacitor can be effectively reduced internally.

In the above, in relation to the structure and shape of the antenna structure 1000 performing a cooling function, the antenna structure 1000 including turn antennas constituting three turns has been mainly described, but the technical idea of the present specification is not limited thereto. The descriptions may be similarly applied to the antenna structure 1000 including one or more turn antennas. Furthermore, the descriptions may be similarly applied to the antenna structure 1000 including a plurality of layers, and of course, the descriptions may be similarly applied to the antenna structure 1000 including a plurality of antenna segments described above.

Hereinafter, a turn-to-turn connecting member for connecting turn antennas in the antenna structure 1000 will be described in detail with reference to FIGS. 16 and 19 to 22.

FIGS. 19 to 22 are diagrams of a method of connecting antennas having different cross-sections in an antenna structure according to one embodiment of the present specification.

A turn-to-turn connecting member may refer to a member at which different turn antennas are connected to each other or a member which connects different turn antennas. Hereinafter, in order to describe a turn-to-turn connecting member which connects turn antennas having different cross-sections among turn-to-turn connecting members, as a representative example, the first turn-to-turn connecting member 3210 shown in FIG. 15 will be mainly described, but the technical idea of the present specification is not limited thereto.

The first turn-to-turn connecting member 3210 may be formed to be bent. For example, referring to FIGS. 16 and 19, a first turn antenna 3110 and a second turn antenna 3120 may be electrically or physically connected in a bent state.

The first turn-to-turn connecting member 3210 may be formed in a linear shape. For example, referring to FIGS. 20 and 21, the first turn antenna 3110 and the second turn antenna 3120 may be electrically or physically connected on the same straight line.

The first turn-to-turn connecting member 3210 may include one end connected to the first turn antenna 3110 and the other end connected to the second turn antenna 3120. Here, one end and the other end of the first turn-to-turn connecting member 3210 may have different cross-sections. Specifically, a cross-section of one end of the first turn-to-turn connecting member 3210 may have a cross-section of the first turn antenna 3110, and a cross-section of the other end of the first turn-to-turn connecting member 3210 may have a cross-section of the second turn antenna 3120. For example, the cross-section of one end of the first turn-to-turn connecting member 3210 may have a rectangular shape, and the cross-section of the other end of the first turn-to-turn connecting member 3210 may have a circular shape.

The first turn-to-turn connecting member 3210 may be formed by transforming a shape of at least one of the first turn antenna 3110 and the second turn antenna 3120 to connect the first turn antenna 3110 and the second turn antenna 3120.

As an example, referring again to FIG. 20, the first turn-to-turn connecting member 3210 may be formed by expanding or extending an end portion of the first turn antenna 3110 and coupling the second turn antenna 3120 thereto.

Here, a size or shape of a cross-section of the first turn-to-turn connecting member 3210 may be changed in a direction from one end to the other end thereof. For example, a cross-sectional area of the first turn-to-turn connecting member 3210 may be gradually increased and decreased in a direction from one end to the other thereof. For another example, the cross-sectional area of the first turn-to-turn connecting member 3210 may be changed in order from a rectangular shape, a round rectangular corner shape, and a circular shape in a direction from one end to the other end thereof.

For still another example, referring again to FIG. 21, the first turn-tor-turn connecting member 3210 may also be formed by coupling an end portion of the second turn antenna 3120 to an end portion of the first turn antenna 3110 to expand or extend the second turn antenna 3120.

Figure 20:
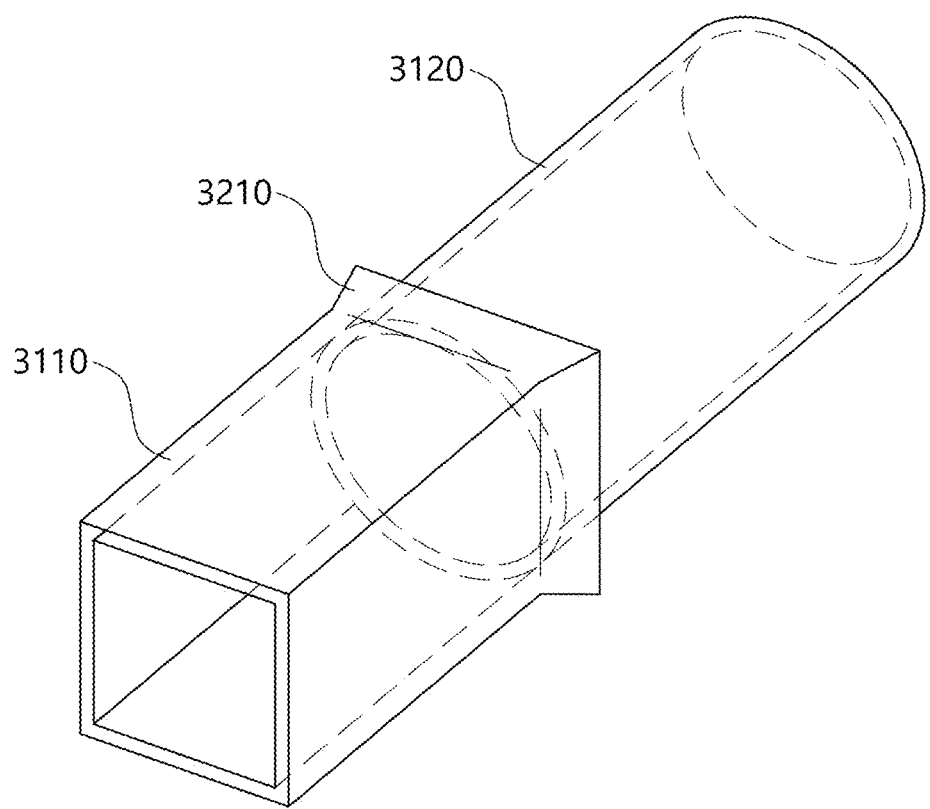
Figure 21:
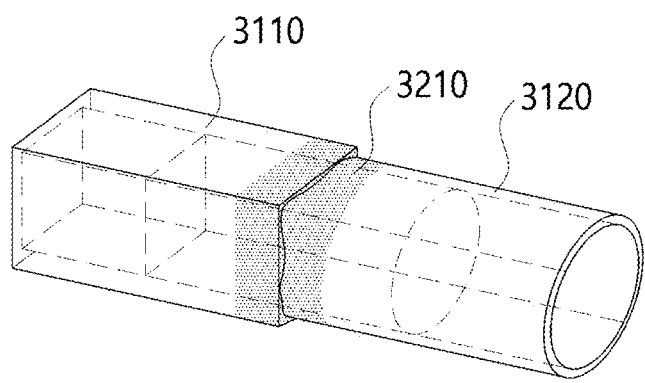
Figure 22:
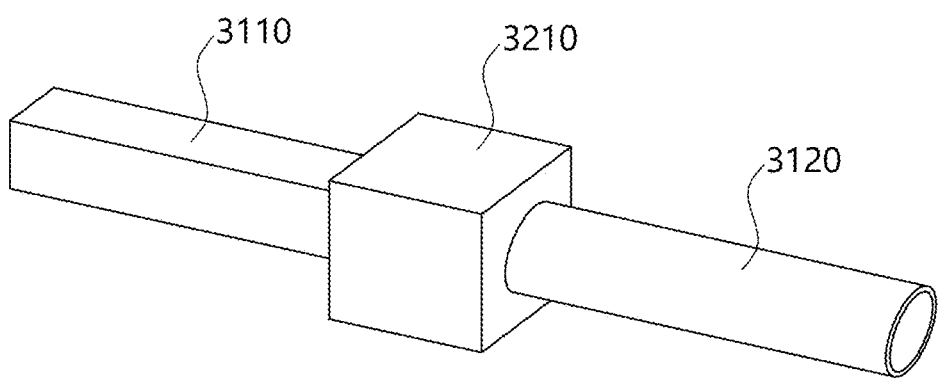

When the first turn antenna 3110 and the second turn antenna 3120 are connected, the cross-sections of the first turn antenna 3110 and the second turn antenna 3120 may be set to correspond to each other. For example, a width of the cross-section of the first turn antenna 3110 may be set to be the same as or different from a width of the cross-section of the second turn antenna 3120. Specifically, in order for the second turn antenna 3120 to be easily inserted into the first turn antenna 3110, the width of the cross-section of the first turn antenna 3110 may be greater than the width of the second turn antenna 3120. Alternatively, the cross-section of the first turn antenna 3110 and the cross-section of the second turn antenna 3120 may have the same width, and as shown in FIGS. 20 and 21, the first turn antenna 3110 and the second turn antenna 3120 may also be connected to each other by expanding, extending, or contracting any one of the turn antennas. The cross-sectional size of each of the turn antennas may be set in consideration of a smooth flow of a coolant.

The first turn-to-turn connecting member 3210 may be provided as a modular type. For example, referring to FIG. 22, the first turn-to-turn connecting member 3210 may include insertion portions having sizes corresponding to cross-sectional sizes of the first turn antenna 3110 and the second turn antenna 3120. In this case, the first turn antenna 3110 and the second turn antenna 3120 may be detachable from the first turn-to-turn connecting member 3210. Furthermore, for example, the first turn-to-turn connecting member 3210 may electrically or physically connect the first turn antenna 3110 and the second turn antenna 3120 and may perform a specific function. Specifically, the first turn-to-turn connecting member 3210 may include a capacitive element. In this case, the first turn-to-turn connecting member 3210 may function as the above-described turn-to-turn capacitive element.

Meanwhile, a shape of a coolant channel may be transformed in a turn-to-turn connecting member. For example, the coolant channel may be gradually narrowed in the first turn-to-turn connecting member 3210. For another example, the coolant channel may be gradually widened in the first turn-to-turn connecting member 3210. For still another example, the coolant channel may be gradually widened and then narrowed in the first turn-to-turn connecting member 3210. In this case, since the shape of the coolant channel is transformed, a flow rate of a coolant may be changed.

Hereinafter, another method of efficiently cooling heat generated in a plasma generating unit 2000 due to plasma induction will be described with reference to FIG. 23.

Figure 23:
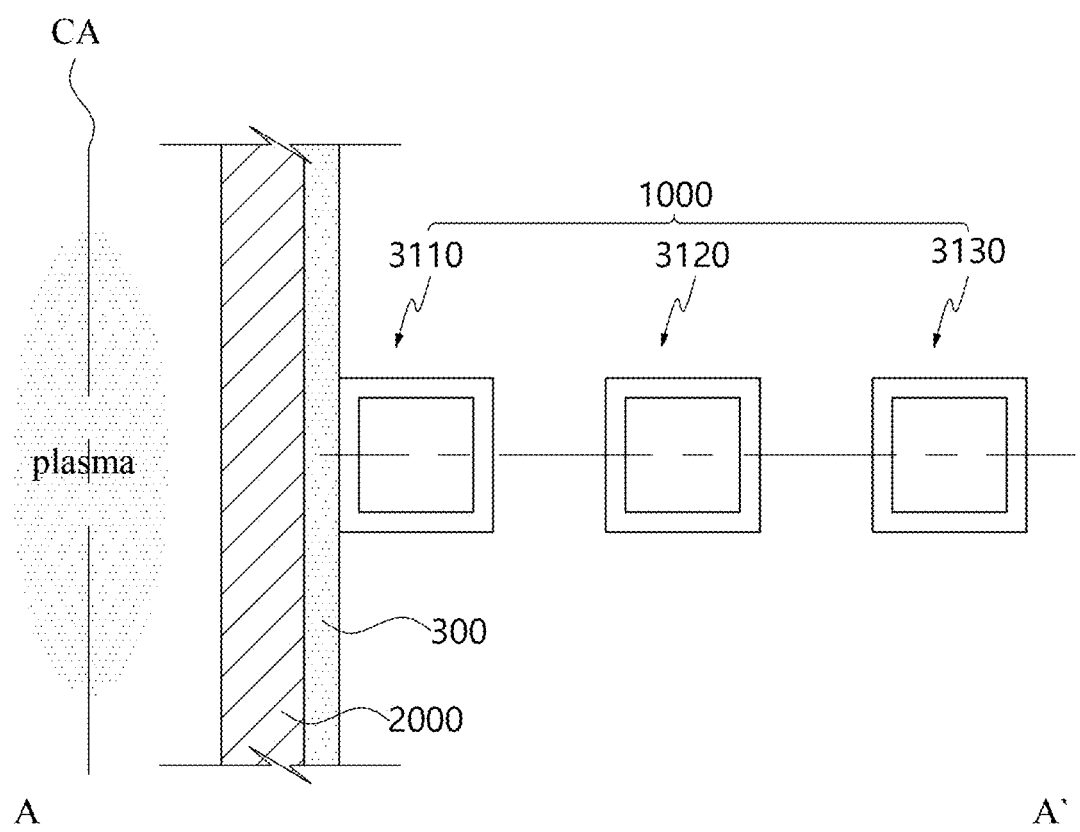
FIG. 23 is a diagram illustrating a heat transfer member according to one exemplary embodiment of the present specification.

FIG. 23 is a diagram illustrating a heat transfer member 300 according to one embodiment of the present specification.

Referring to FIG. 23, the heat transfer member 300 may transfer heat between an antenna structure 1000 and a plasma generating unit 2000. For example, the heat transfer member 300 may absorb heat generated by the plasma generating unit 2000 due to plasma induction and provide the absorbed heat to the antenna structure 1000.

The heat transfer member 300 may be made of a material having high thermal conductivity. For example, the heat transfer member 300 may be made of at least one selected from among aluminum, gold, silver, tungsten, and/or copper.

The heat transfer member 300 may have various shapes. For example, the heat transfer member 300 may have a shape corresponding to the plasma generating unit 2000. Specifically, when the plasma generating unit 2000 has a hollow cylinder shape, the heat transfer member 300 may also be implemented in a hollow cylinder shape. For another example, the heat transfer member 300 may have a shape so as to be in surface contact with an outer surface of the plasma generating unit 2000. Specifically, at least a portion of the heat transfer member 300 may be curved or flat. For still another example, the heat transfer member 300 may be provided as a plurality of physically separated plates. Meanwhile, the shape of the heat transfer member 300 is not limited to the above-described shape, and as described below, the heat transfer member 300 may have any shape as long as the shape of the heat transfer member 300 may be in surface contact with the plasma generating unit 2000 or the antenna structure 1000.

The heat transfer member 300 may be disposed between the antenna structure 1000 and the plasma generating unit 2000. For example, the heat transfer member 300 may be disposed to surround the plasma generating unit 2000, and the antenna structure 1000 may be disposed to surround the heat transfer member 300. Specifically, the heat transfer member 300 may be disposed to be in surface contact with an outer wall of the plasma generating unit 2000 and may be disposed to be in surface contact with an innermost turn antenna of the antenna structure 1000 (for example, a first turn antenna 3110) with respect to a central axis CA.

As described above, the plasma generating unit 2000 and the antenna structure 1000 may be thermally coupled through the heat transfer member 300. In this case, since the heat transfer member 300 is made of a material having high thermal conductivity, heat generated in the plasma generating unit 2000 due to plasma induction can be more quickly moved to the antenna structure 1000 through the heat transfer member 300, thereby improving plasma induction and maintenance efficiency and improving the durability of the plasma generating unit 2000.

In the above, a case has been mainly described in which the antenna structure 1000 is provided with a plurality of turn antennas, but the technical idea of the present specification is not limited thereto. Of course, the descriptions may also be similarly applied to a case in which the antenna structure 1000 is provided with a single turn antenna, a plurality of layers of single turn antennas, or a plurality of antenna segments.

Methods according to embodiments of the present invention may be implemented in the form of program instructions executable through diverse computing means and may be recorded in computer readable media. The computer-readable media may include, independently or in combination, program instructions, data files, data structures, and so on. Program instructions recorded in the media may be specially designed and configured for the embodiments or may be generally known by those skilled in the computer software art. Computer-readable recording media may include magnetic media such as hard disks, floppy disks, and magnetic tapes, optical media such as a compact disc read only memory (CD-ROM) and a digital versatile disc (DVD), magneto-optical media such as floptical disks, and hardware units, such as a read only memory (ROM), a random access memory (RAM), a flash memory, and so on, which are intentionally formed to store and perform program instructions. Program instructions may include high-class language codes executable by computers using interpreters, as well as machine language codes such as those made by compilers. The hardware units may be configured to function as one or more software modules for performing the operations according to the embodiments of the present invention, and vice versa.

While embodiments of the present invention have been shown and described with reference to the accompanying drawings thereof, it will be understood by those skilled in the art that various changes and modifications in form and details may be made therein. For example, desired results may be achieved although the embodiments of the present invention are performed in other sequences different from the descriptions, and/or the elements, such as a system, a structure, a device, a circuit, and so on, are combined or assembled in other ways different from the descriptions, or replaced or substituted with other elements or their equivalents.

Therefore, other implementations, other embodiments, and equivalents of the appended claims may be included in the scope of the appended claims.

What is claimed is:

1. An antenna structure inducing a plasma in a chamber by receiving AC power, comprising:
a first and second antenna segment, arranged on a first plane intersecting a virtual central axis, wherein the first antenna segment has a first radius of curvature about the central axis and the second antenna segment has a second radius of curvature about the central axis; and
a first capacitive load, electrically connecting the first antenna segment and the second antenna segment in series;
wherein the first antenna segment, having the first radius of curvature, extends from one end of the first capacitive load by a first length, and the second antenna segment, having the second radius of curvature, extends from other end of the first capacitive load by a second length, and
wherein a total of the first length and the second length is less than a circumference corresponding to the first radius of curvature or the second radius of curvature.

2. The antenna structure of claim 1,
wherein the first radius of curvature and the second radius of curvature are equal and the first length and the second length are equal, and
wherein the first antenna segment and the second antenna segment have equal inductance.

3. The antenna structure of claim 1, further comprising:
a third antenna segment, arranged on the first plane and having a third radius of curvature, which is larger than the first radius of curvature;
a fourth antenna segment, arranged on the first plane and having a fourth radius of curvature, which is larger than the second radius of curvature; and
a second capacitive load, electrically connecting the third antenna segment and the fourth antenna segment in series;
wherein the third antenna segment extends from one end of the second capacitive load by a third length which is longer than the first length, and the fourth antenna segment extends from other end of the second capacitive load by a fourth length which is longer than the second length.

4. The antenna structure of claim 3,
wherein a straight line passing through the first and the second capacitive loads passes through the central axis.

5. The antenna structure of claim 3,
wherein a central angle of a sector, having the first antenna segment as an arc, is equal to a central angle of a sector, having the third antenna segment as an arc.

6. The antenna structure of claim 3, further comprising:
a turn-to-turn capacitive load, electrically connecting the second antenna segment and the third antenna segment in series.

7. The antenna structure of claim 6,
wherein the first capacitive load, the second capacitive load, and the turn-to-turn capacitive load have equal capacitance.

8. The antenna structure of claim 1, further comprising:
a fifth antenna segment, having the first radius of curvature about the central axis;
a sixth antenna segment, having the second radius of curvature; and
a third capacitive load, positioned between the fifth and the sixth antenna segments and electrically connecting the fifth and the sixth antenna segments in series;
wherein the fifth antenna segment and the sixth antenna segment are arranged on a second plane intersecting the central axis, and wherein the first plane and the second plane are different planes.

9. The antenna structure of claim 8, further comprising:
a first interlayer capacitive load, electrically connecting the second antenna segment and the fifth antenna segment in series.

10. The antenna structure of claim 9, further comprising:
a seventh antenna segment, having the first radius of curvature about the central axis;
an eighth antenna segment, having the second radius of curvature;
a fourth capacitive load, positioned between the seventh and the eighth antenna segments and electrically connecting the seventh and the eighth antenna segments in series; and
a second interlayer capacitive load, electrically connecting the sixth antenna segment and the seventh antenna segment in series;
wherein the seventh antenna segment and the eighth antenna segment are arranged on a third plane which intersects the central axis and is different from the first plane and the second plane, and
wherein the first interlayer capacitive load and the second interlayer capacitive load have a predetermined angle about the central axis.

11. The antenna structure of claim 1,
wherein the first antenna segment extends from one end to other end and the other end of the first antenna segment is electrically connected to the one end of the first capacitive load, and
wherein the second antenna segment extends from one end to other end and the other end of the second antenna segment is electrically connected to the other end of the first capacitive load.

12. The antenna structure of claim 11,
wherein as the AC power is applied to the antenna structure, a maximum voltage to a reference node at the other end of the first antenna segment corresponds to a maximum voltage to the reference node at the other end of the second antenna segment.

13. The antenna structure of claim 11,
wherein as the AC power is applied to the antenna structure, a voltage of the other end of the second antenna segment to the one end of the second antenna segment corresponds to a voltage of the other end of the first antenna segment to the one end of the first antenna segment.

14. The antenna structure of claim 11,
wherein as the AC power is applied to the antenna structure, a maximum voltage value of the other end of the first antenna segment to a reference node corresponds to a maximum voltage value of the one end of the second antenna segment to the reference node.

15. The antenna structure of claim 11,
wherein at an arbitrary time point after the AC power is applied to the antenna structure, a voltage of the other end of the first antenna segment to a reference node has an opposite sign with a voltage of the one end of the second antenna segment to the reference node.

16. The antenna structure of claim 11, further comprising:
a first point, located between the one end and the other end of the first antenna segment; and
a second point, located between the one end and the other end of the second antenna segment;
wherein as the AC power is applied to the antenna structure, a maximum voltage of the first point to a reference node corresponds to a maximum voltage of the second point to the reference node.

17. The antenna structure of claim 11,
wherein at an arbitrary time point after the AC power is applied to the antenna structure, a voltage of the other end of the first antenna segment to a reference node corresponds to a voltage of the one end of the second antenna segment to the reference node.

18. The antenna structure of claim 1,
wherein the antenna structure is implemented in at least one of a plane type for inducing a plasma in an upper part or lower part of the antenna structure, and a tube type for inducing a plasma in a center of the antenna structure.

19. A plasma generating device, comprising:
a plasma generating unit, including an inner space where a plasma is induced; and
a first antenna structure, having a first radius of curvature about a virtual central axis and disposed outside of the plasma generating unit;
wherein the first antenna structure includes a plurality of first antenna segments having the first radius of curvature and at least one first capacitive load arranged between the plurality of first antenna segments such that the plurality of first antenna segments are electrically connected in series,
wherein the plurality of first antenna segments overlap at least partially with a virtual first plane perpendicular to the central axis, and
wherein each of the plurality of first antenna segments has a first length, and a total length of the plurality of first antenna segments is less than a circumference corresponding to the first radius of curvature.

20. The plasma generating device of claim 19, further comprising:
a second antenna structure, having a second radius of curvature larger than the first radius of curvature about the central axis and arranged on the first plane;
wherein the second antenna structure includes a plurality of second antenna segments having the second radius of curvature and at least one second capacitive load arranged between the plurality of second antenna segments such that the plurality of second antenna segments are electrically connected in series, and
wherein each of the plurality of second antenna segments has the first length, and a total length of the plurality of second antenna segments is less than a circumference corresponding to the second radius of curvature.

21. The plasma generating device of claim 19,
wherein a thickness of the plasma generating unit is 0.5 mm or more and 30 mm or less, and
wherein a width of the plasma generating unit is 10 mm or more and 300 mm or less.

22. The plasma generating device of claim 19,
wherein at least a portion of the plasma generating unit is made of at least one of aluminum oxide, silicon nitride, silicon dioxide, yttrium oxide, ceramic, silicon carbide, and a combination thereof.

* * * * *